(12) United States Patent
Higuchi et al.

(10) Patent No.: US 7,223,305 B2
(45) Date of Patent: *May 29, 2007

(54) METHOD OF MANUFACTURING POTASSIUM NIOBATE SINGLE CRYSTAL THIN FILM, SURFACE ACOUSTIC WAVE ELEMENT, FREQUENCY FILTER, FREQUENCY OSCILLATOR, ELECTRIC CIRCUIT, AND ELECTRONIC APPARATUS

(75) Inventors: Takamitsu Higuchi, Matsumoto (JP); Setsuya Iwashita, Nirasaki (JP); Hiromu Miyazawa, Toyoshima-machi (JP)

(73) Assignee: Seiko Epson Corporation (JP)

( * ) Notice: Subject to any disclaimer, the term of this patent is extended or adjusted under 35 U.S.C. 154(b) by 363 days.

This patent is subject to a terminal disclaimer.

(21) Appl. No.: 10/761,147

(22) Filed: Jan. 20, 2004

(65) Prior Publication Data

US 2004/0197599 A1    Oct. 7, 2004

(30) Foreign Application Priority Data

Jan. 22, 2003    (JP)    ............................. 2003-013608

(51) Int. Cl.
*C30B 29/30*    (2006.01)
(52) U.S. Cl. ............................. 117/68; 117/70; 117/45; 117/940
(58) Field of Classification Search ............ 117/68, 117/70, 45, 940
See application file for complete search history.

(56) References Cited

U.S. PATENT DOCUMENTS

| | | | |
|---|---|---|---|
| 5,419,824 A | * | 5/1995 | Weres et al. ................ 204/268 |
| 5,824,419 A | | 10/1998 | Kawai et al. |
| 6,203,860 B1 | | 3/2001 | Kawai et al. |
| 6,510,597 B2 | * | 1/2003 | Yoshida et al. ............ 29/25.35 |
| 2001/0029884 A1 | * | 10/2001 | Imaeda et al. ................ 117/84 |
| 2004/0237882 A1 | * | 12/2004 | Higuchi et al. ................ 117/95 |
| 2005/0076829 A1 | * | 4/2005 | Higuchi et al. ................ 117/92 |
| 2005/0200235 A1 | * | 9/2005 | Higuchi et al. ......... 310/313 R |
| 2005/0206271 A1 | * | 9/2005 | Higuchi et al. ............. 310/311 |

FOREIGN PATENT DOCUMENTS

| | | |
|---|---|---|
| JP | 2001-068964 | 3/2001 |
| JP | 2001-185988 | 7/2001 |
| JP | 2001-196892 | 7/2001 |

OTHER PUBLICATIONS

Christen, H.-M. et al, "The growth and properties of epitaxial $KNbO_3$ thin films and $KNbOe/KTaOe$ superlattices", Appl. Phys. Lett 68, Mar. 11, 1996, pp. 1488-1490.

* cited by examiner

*Primary Examiner*—Robert Kunemund
(74) *Attorney, Agent, or Firm*—Harness, Dickey & Pierce, P.L.C.

(57) ABSTRACT

A method of manufacturing a potassium niobate ($KNbO_3$) single crystal thin film, includes the steps of maintaining the substrate under a predetermined oxygen partial pressure; maintaining the substrate within a temperature region which is equal to or higher than an eutectic temperature of $KNbO_3$ and $3K_2O.Nb_2O_5$ and is equal to or lower than complete melting temperature of $KNbO_3$ and $3K_2O.Nb_2O_5$ so that a solid phase of $KNbO_3$ and a liquid phase can coexist on the substrate; depositing a vapor phase material on the substrate in a state in which a solid phase and a liquid phase coexist; and precipitating $KNbO_3$ on the substrate from the liquid phase as a solid phase to grow a $KNbO_3$ single crystal thin film. The composition of a starting material to be vaporized to generate the vapor phase material is from $K_2O.Nb_2O_5=50:50$ to $K_2O.Nb_2O_5=65:35$.

11 Claims, 16 Drawing Sheets

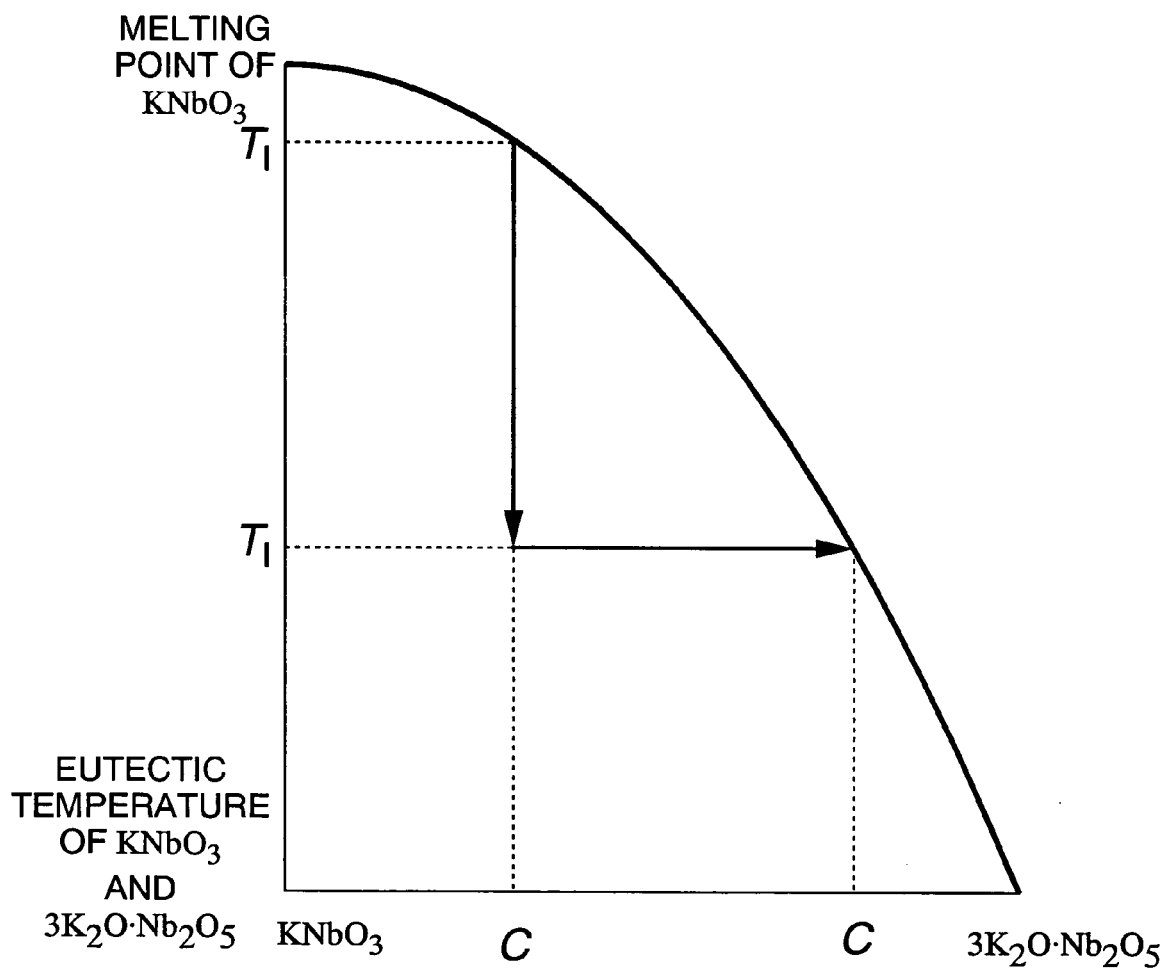

METHOD OF MANUFACTURING POTASSIUM NIOBATE SINGLE CRYSTAL THIN FILM, SURFACE ACOUSTIC WAVE ELEMENT, FREQUENCY FILTER, FREQUENCY OSCILLATOR, ELECTRIC CIRCUIT, AND ELECTRONIC APPARATUS

BACKGROUND OF THE INVENTION

1. Field of the Invention

The present invention relates to a surface acoustic wave element used in telecommunication devices, and in particular relates to a surface acoustic wave element that uses a piezoelectric thin film.

2. Description of the Related Art

There has been a remarkable expansion in the demand for surface acoustic wave elements with the rapid developments in the telecommunication field centered on mobile communication, which is typified by mobile telephones. Some trends in the development of surface acoustic wave elements include size reduction, increasing efficiency, and increasingly higher frequencies. In order to attain these, a larger electromechanical coupling coefficient (below, $k^2$), more stable temperature characteristics, and a higher surface acoustic wave propagation velocity become necessary. For example, when used as a high frequency filter, a high $k^2$ is desirable in order to obtain a pass band having a small loss and a wide bandwidth. In order to make the resonance frequency a high frequency, a material having a faster acoustic velocity is desirable in view of the limits of the design rules for the pitch of interdigital transducers (below IDT). Furthermore, in order to stabilize the characteristics of the temperature range in which surface acoustic wave elements are used, the center frequency temperature coefficient (TCF) must be small.

Conventionally, surface acoustic wave elements generally have a structure in which an IDT is formed on a single crystal piezoelectric body. Representative piezoelectric single crystals are quartz, lithium niobate (below, $LiNbO_3$), lithium tantalite (below, $LiTaO_3$), and the like.

For example, in an RF filter requiring a broad band and low loss in the pass band, $LiNbO_3$, which has a large $k^2$, is used. In contrast, in an IF filter requiring stable temperature characteristics even in a narrow band, quartz, which has a small TCF, is used. Furthermore, $LiTaO_3$ plays an intermediate role because its $k^2$ and TCF are each between those of $LiNbO_3$ and quartz. However, even for $LiTaO_3$, which has the highest $k^2$, the $k^2$ is about 20%.

Recently, a cut angle that exhibits a large $k^2$ value has been discovered in the $KNbO_3$ single crystal (a=0.5695 nm, b=0.5721 nm, c=0.3973 nm; below, the orthorhombic crystal is represented by these indices). As reported in Electron. Lett. Vol. 33 (1997) 193, it can be predicted by calculation that a 0° Y-cut X-propagation (below, 0° Y-X) $KNbO_3$ single crystal plate shows an extremely high value of $k^2$=53%. Furthermore, as reported in Jpn. J. Appl. Phys. Vol. 37 (1998) 2929, it has been experimentally confirmed that a 0° Y-X $KNbO_3$ single crystal plate demonstrates a high value of $k^2$ (about 50%), and it is reported that the oscillation frequency of the filter using the Y-X $KNbO_3$ single crystal plate rotated from 45° to 75° demonstrates zero temperature properties at room temperature. A patent application has been filed for these rotated Y-X $KNbO_3$ single crystal plates that includes 0° Y-X as Japanese Unexamined Patent Application, First Publication, No. Hei 10-65488.

In surface acoustic wave elements that use a piezoelectric single crystal substrate, characteristics such as $k^2$, the temperature coefficient, sound velocity and the like are values intrinsic to the material, and are determined by the cut angle and the propagation direction. A 0° Y-X $KNbO_3$ single crystal substrate has a superior $k^2$, but the zero temperature properties like those of the Y-X $KNbO_3$ single crystal substrate rotated from 45° to 75° are not exhibited at room temperature. In addition, the propagation velocity is slow in comparison to $SrTiO_3$ and $CaTiO_3$, which are also perovskite-type oxides. Thus, when only a $KNbO_3$ single crystal substrate is used, the sound velocity, high $k^2$, and zero temperature properties cannot all be satisfied.

Thus, a piezoelectric thin film is laminated on some sort of substrate, film thickness is controlled, and thereby it is anticipated that the sound velocity, $k^2$, and temperature characteristics will be improved. Examples include a zinc oxide (below, ZnO) thin film formed on a sapphire substrate, as reported in Jpn. J. Appl. Phys. Vol 32 (1993) 2337, or a $LiNbO_3$ thin film formed on a sapphire substrate, as reported in Jpn. J. Appl. Phys. Vol. 32 (1993) L745. Therefore, for $KNbO_3$ as well, it is anticipated that all properties will be improved by depositing a thin film onto a substrate.

Here, it is preferable that the piezoelectric thin film be oriented in an optimal direction in order to exhibit its $k^2$ and temperature characteristics, and it is preferable that it be a flat, compact epitaxial film in order to minimize as much as possible the loss that accompanies leaky wave propagation. Here, a Y-X $KNbO_3$ having a $k^2$ of about 50% corresponds to the pseudo-cubic crystal (100), and the 90° Y-X $KNbO_3$ having a $k^2$ of 10% corresponds to the pseudo-cubic crystal (110). Therefore, for example, by using a $SrTiO_3$(100) or (110) single crystal substrate, it is possible to obtain a Y-X $KNbO_3$ thin film having a $k^2$ of about 50% or a 90° Y-X $KNbO_3$ thin film having a $k^2$ of about 10%.

However, the surface acoustic wave element using these $KNbO_3$ piezoelectric thin films have the following problems.

When manufacturing a $KNbO_3$ thin film, K vaporizes easily in comparison to Nb because the saturation vapor pressure of K is extremely high compared to Nb. Thus, there is the problem that in comparison to the starting composition, the composition of the thin film after manufacture deviates towards the Nb excess side. In order to compensate for this deviation in composition, as reported, for example, in Appl. Phys. Lett. Vol. 68 (1996) 1488, when manufacturing a $KNbO_3$ thin film by using a laser ablation, a target made in advance with an excess of K is used. However, as is clear from the phase diagram of the $K_2O.Nb_2O_5$ shown in FIG. 1 of J. Am. Chem. Soc. Vol. 77 (1955) 2117, on side where the composition of the $KNbO_3$ has a K excess, a $3K_2O.Nb_2O_5$ compound is present. At or below the eutectic temperature of 845° for $KNbO_3$ and $3K_2O.Nb_2O_5$, both $KNbO_3$ and $3K_2O.Nb_2O_5$ coexist as a solid phase. On the side where the composition of the $KNbO_3$ has an Nb excess, a $2K_2O.3Nb_2O_5$ compound is present, and at or below the melting point of 1039° C. of $KNbO_3$, both the $KNbO_3$ and the $2K_2O.3Nb_2O_5$ coexist in a solid phase. Therefore, at the point in time that the starting material that has been ablated by a laser arrives at the substrate, if the composition is not strictly K:Nb=50:50, a film manufactured either on the K excess side or the Nb excess side will include different phases, and a single phase cannot be obtained.

Here, in the case of a $KNbO_3$ bulk single crystal, a large single crystal can be obtained, for example, by pulling up the single crystal from a liquid phase (Top-Seeded Solution Growth (TSSG)) having a composition with a slight K excess over the K:Nb=50:50 by using a seed crystal. In the $K_2O.Nb_2O_5$ two dimensional system phase diagram in FIG.

1, this is obtained by placing the starting material having a composition from $K_2O:Nb_2O_5=50:50$ to about $K_2O:Nb_2O_5=65:35$ within the range in which the $KNbO_3$ and the liquid phase coexist. The $KNbO_3$ is present at or above the eutectic temperature of 845° C. of $KNbO_3$ and $3K_2O.Nb_2O_5$. That is, in FIG. 2, when the starting material having composition $C_1$ is cooled from the liquidus temperature $T_{11}$ to the crystal growth temperature $T_{12}$, the $KNbO_3$ precipitates from the liquid phase, and the liquid phase deviates towards the K excess side up to composition $C_2$, in which $T_{12}$ serves as the liquidus temperature. Because the crystal growth rate at this time becomes higher as $C_1$–$C_2$ becomes larger, preferably there is slightly more K than $KNbO_3$, and as far as possible a composition close to $KNbO_3$ is cooled down to the region of the eutectic temperature 845° of the $KNbO_3$ and the $3K_2O.Nb_2O_5$. The above behavior occurs in the atmosphere, and furthermore, occurs when a $KNbO_3$ bulk single crystal is grown from a high volume liquid phase.

Thus, it is an object of the present invention to provide a crystal growth process in which a single crystal is precipitated from the liquid phase in the atmosphere, that is applied to a thin film production process using a vapor phase method under reduced pressure, thereby growing epitaxially a high quality $KNbO_3$ single crystal thin film on any type of single crystal substrate. Furthermore, it is an object of the invention to provide a surface acoustic wave element that can be adapted to high frequencies, has a high $k^2$, and can be expected to exhibit effects with respect to size reduction and energy savings.

SUMMARY OF THE INVENTION

In a method of manufacturing a potassium niobate single crystal thin film according to a first aspect of the invention, in the manufacturing process of the potassium niobate thin film by a vapor phase method, a substrate is maintained, under a predetermined oxygen partial pressure, and within a temperature range no less than the eutectic temperature and no more than the complete melting temperature of $KNbO_3$ and $3K_2O.Nb_2O_5$, that is, the temperature range in which $KNbO_3$ and the liquid phase coexist; a vapor phase material is deposited on the substrate in a state in which solid and liquid phases coexist; and $KNbO_3$ is precipitated from the liquid phase as a solid phase, and thereby a $KNbO_3$ thin film is grown.

According to the above method, there are the effects that it is possible to obtain a potassium niobate thin film in the form of a single crystal from a liquid phase, and that a surface acoustic wave element having a superior electromechanical coupling constant can be obtained.

The composition of the starting material vaporized to serve as a vapor phase may be from $K_2O:Nb_2O_5=50:05$ to $K_2O:Nb_2O_5=65:35$.

In this case, it is possible to obtain a potassium niobate single crystal thin film whose composition does not deviate from K:Nb=50:50, and a surface acoustic wave element having a superior electromechanical coupling coefficient can be obtained.

The above-mentioned substrate may have a structure wherein, at its surface, the crystal axes are oriented with respect to the surface in both the perpendicular and parallel directions, and the $KNbO_3$ precipitated from the liquid phase grows into a single crystal by using the substrate as the seed crystal.

In this case, it is possible to obtain a potassium niobate single crystal thin film whose orientation directions are arranged along the entire thin film by using the substrate as the seed crystal, and a surface acoustic wave element having a superior electromechanical coupling coefficient can be obtained.

The manufacturing step for the potassium niobate thin film may include a step in which an adhering layer of the liquid phase component, which remains on the surface after the crystal growth, is physically or chemically removed.

In this case, it is possible to obtain a single phase potassium niobate single crystal thin film by removing the liquid phase component whose composition deviates from K:Nb=50:50 to the K excess side, and a surface acoustic wave element having a superior electromechanical coupling coefficient can be obtained.

The manufacturing step for the potassium niobate thin film may include a step in which, before the step of precipitating the $KNbO_3$ from the liquid phase, the substrate surface is terminated in advance by niobe atoms and potassium atoms slowly deposited with the object of improving the crystallinity.

In this case, the crystallinity of the potassium niobate thin film is improved, and a surface acoustic wave element having a superior electromechanical coupling coefficient can be obtained.

The above substrate may have a structure consisting of a silicon single crystal substrate, a buffer layer that is epitaxially grown on the silicon single crystal substrate, and a potassium niobate single crystal thin film that is epitaxially grown on the buffer layer.

In this case, it is possible to grow the potassium niobate single crystal thin film on the silicon single crystal substrate, and a surface acoustic wave having a superior electromechanical coupling coefficient can be obtained at a low cost.

The above buffer layer may consist of a first buffer layer consisting of an NaCl-type oxide that includes a metal that thermodynamically bonds more easily to oxygen than silicon, and a second buffer layer consisting of a simple perovskite-type oxide deposited on this first buffer layer.

In this case, it is possible to grow epitaxially a high quality potassium niobate single crystal thin film on a silicon single crystal substrate, and a surface acoustic wave element having a superior electromechanical coupling coefficient can be obtained at low cost.

The buffer layer may consist of a first buffer layer consisting of a fluorite-type oxide that includes a metal that thermodynamically bonds more easily to oxygen than silicon, a second buffer layer consisting of a layered perovskite-type oxide deposited on this first buffer layer, and a third buffer layer consisting of a simple perovskite-type oxide deposited on the second buffer layer.

In this case, it is possible to grow epitaxially a high quality potassium niobate-single crystal thin film on a silicon substrate, and a surface acoustic wave element having a superior electromechanical coupling coefficient can be obtained at a low cost.

The substrate may have a structure consisting of a substrate that is either a single crystal, a polycrystal, or an amorphous crystal, a buffer layer having an in-plane orientation irrespective of the crystal orientation of this substrate that is grown on this substrate by a vapor phase method involving ion beam irradiation, and a potassium niobate single crystal thin film grown epitaxially on this buffer layer.

In this case, it is possible to grow a potassium niobate single crystal thin film on any arbitrary substrate, and a surface acoustic wave element having a superior electromechanical coupling coefficient can be obtained at a low cost.

The buffer layer may consist of a first layer consisting of an NaCl-type oxide and a second buffer layer consisting of a simple perovskite-type oxide that is deposited on this first buffer layer.

In this case, it is possible to grow a potassium niobate single crystal thin film on any arbitrary substrate, and a surface acoustic wave element having a superior electromechanical coupling coefficient can be obtained at a low cost.

The buffer layer may consist of a first buffer layer consisting of a fluorite-type oxide, a second buffer layer consisting of a layered perovskite-type oxide that is deposited on the first buffer layer, and a third buffer layer consisting of a simple perovskite-type oxide that is deposited on the second buffer layer.

In this case, it is possible to grow a potassium niobate single crystal thin film on any arbitrary substrate, and a surface acoustic wave element having a superior electromechanical coupling coefficient can be obtained at a low cost.

Surface Acoustic Wave Element

A surface acoustic wave element of the present invention has the potassium niobate single crystal thin film produced by the above manufacturing method.

According to this surface acoustic wave element, by using a potassium niobate single crystal thin film having a high electromechanical coupling coefficient, it is possible to realize a size reduction in the surface acoustic wave element.

Frequency Filter

A frequency filter of the present invention incorporates the above surface acoustic wave element.

According to this frequency filter, by using the potassium niobate single crystal thin film having a high electromechanical coupling coefficient, it is possible to realize broadband filter properties.

Frequency Oscillator

A frequency oscillator of the present invention incorporates the above surface acoustic wave element.

According to this frequency oscillator, by using the potassium niobate single crystal thin film having a high electromechanical coupling coefficient, it is possible to realize a size reduction in the frequency oscillator.

Electronic Circuits

An electric circuit of the present invention incorporates the above surface acoustic wave element.

According to this method, by using the above potassium niobate single crystal thin film having a high electromechanical coupling coefficient, it is possible to realize an energy reduction in the electronic circuits.

Electronic Devices

An electronic device of the present invention includes at least one of the above frequency filter, the above frequency oscillator, or the above electronic circuit.

According to this electronic device, by using the potassium niobate single crystal thin film having a high electromechanical coupling coefficient, it is possible to realize a down sized broadband energy saving electronic device.

BRIEF DESCRIPTION OF THE DRAWINGS

FIG. 2 is a phase diagram showing that when the starting material is cooled from the liquidus temperature to the crystal growth temperature, $KNbO_3$ precipitates, and the composition of the liquid phase deviates to the K excess side.

PREFERRED EMBODIMENTS OF THE PRESENT INVENTION

Below, the embodiments of the present invention will be explained with reference to the figures.

First Embodiment of the Manufacturing Method for the Potassium Niobate Thin Film FIGS. 3A to 3F show cross-sectional diagrams illustrating the first embodiment of the manufacturing method for the potassium niobate single crystal thin film of the present invention, and FIGS. 4A to 4F show the diffraction patterns of the substrate surfaces observed by Reflection High Energy Electron Diffraction (RHEED).

Figure 1:
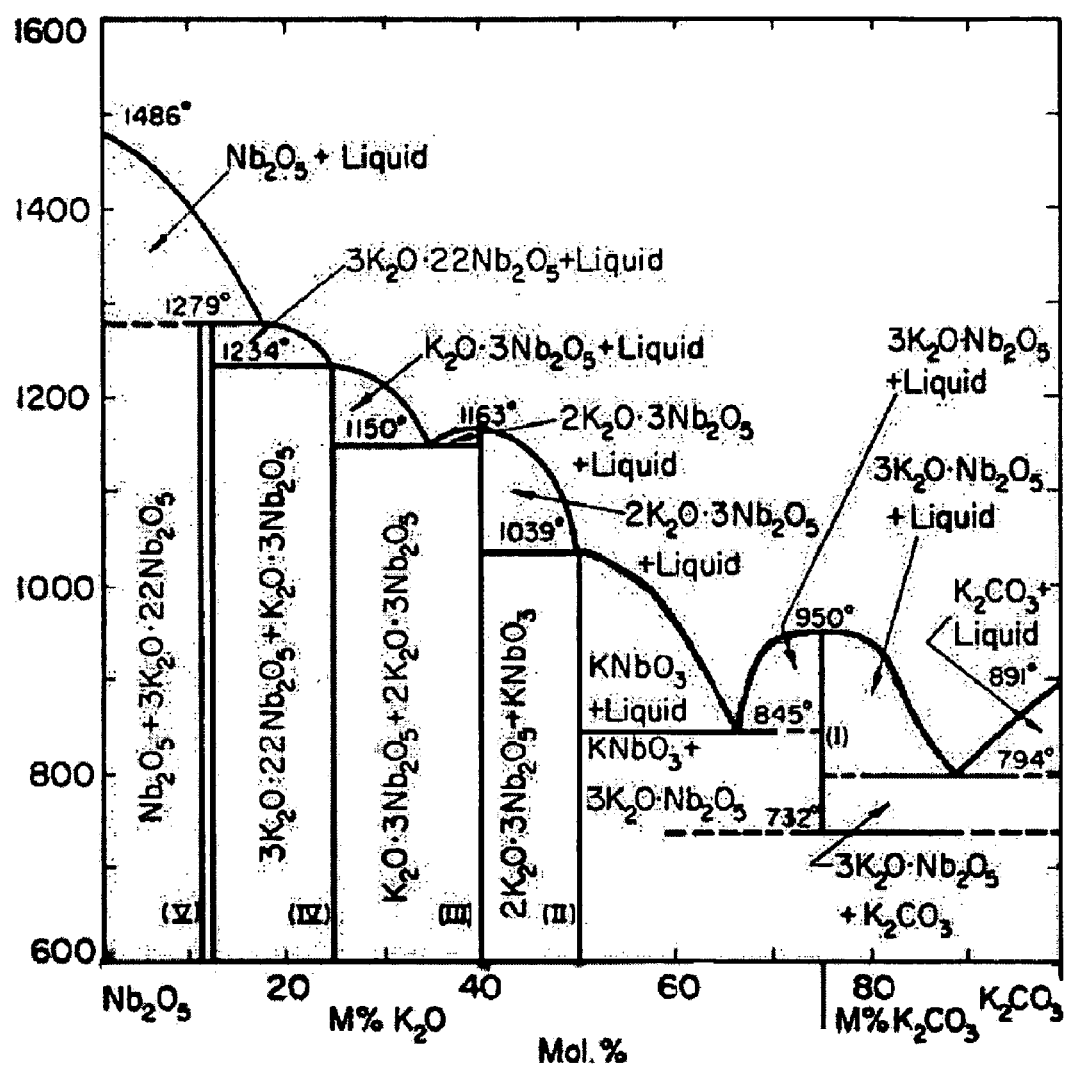
FIG. 1 is a $K_2O$—$Nb_2O_5$ binary phase diagram.
Figure 3A:
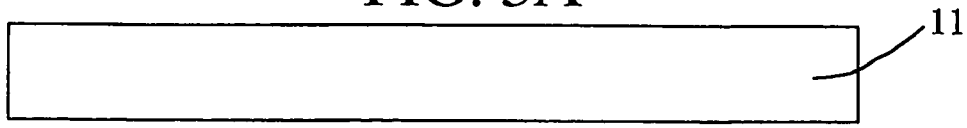
FIGS. 3A to 3F are cross-sectional drawings showing a first embodiment of the manufacturing method for the potassium niobate single crystal thin film of the present invention.
Figure 3B:
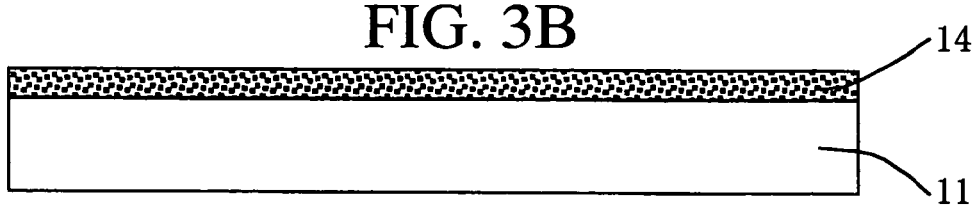
Figure 3C:
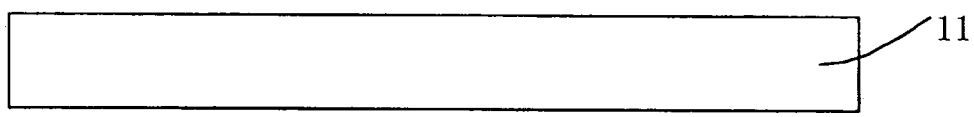
Figure 3D:
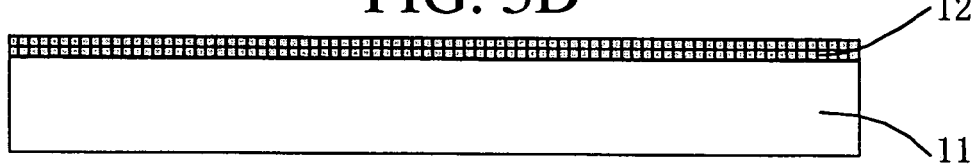
Figure 3E:
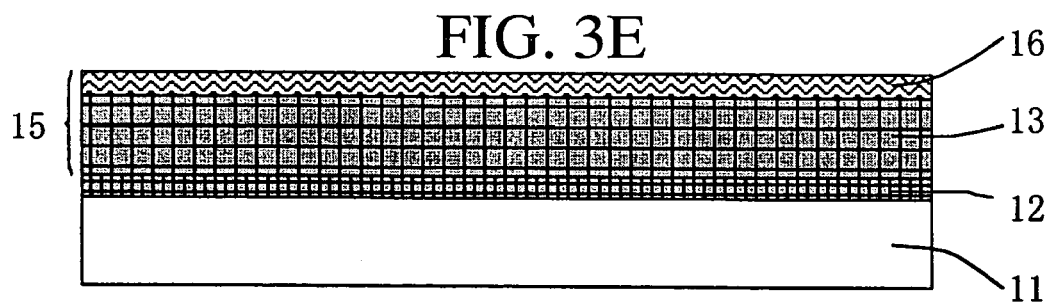
Figure 3F:
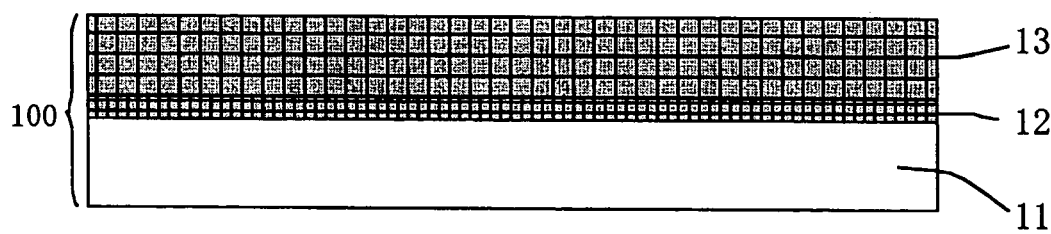

As shown in FIG. 3F, the potassium niobate single crystal thin film 100 of the present embodiment consists of a $SrTiO_3$ single crystal substrate 11, an initial layer 12 consisting of K, Nb, and O that are grown epitaxially on the $SrTiO_3$ single crystal substrate 11, and a $KNbO_3$ single crystal layer 13 that is grown epitaxially on the initial layer 12. The $SrTiO_3$ single crystal substrate 11 here uses a (100) substrate. The initial layer 12 is an interface layer in which the structure transitions from $SrTiO_3$ to $KNbO_3$, and while the structure and composition are not limited, the $KNbO_3$ can be grown epitaxially on the $SrTiO_3$ substrate 11, and the thickness thereof is 5 nm, for example. For the $KNbO_3$ single crystal layer 13, here a $KNbO_3$ single crystal thin film is grown epitaxially in an orthorhombic crystal (001) orientation or an orthorhombic crystal (110) orientation.

Next, the manufacturing method of the potassium niobate single crystal thin film will be described.

A $SrTiO_3$ single crystal substrate 11 is immersed in an organic solvent and undergoes degreasing and cleaning by using an ultrasonic cleaning device. Here, for example, a 1:1 liquid mixture of ethyl alcohol and acetone can be used, but this is not limiting.

Figure 4A:
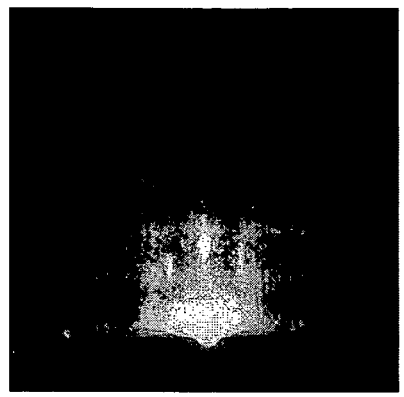
FIG. 4 shows the RHHED pattern observed in the first embodiment of the manufacturing method for the potassium niobate single crystal thin film of the present invention.

After the $SrTiO_3$ single crystal substrates 11 that have undergone degreasing and cleaning are mounted on substrate holders, each substrate holder is introduced into a vacuum apparatus at room temperature and at a negative pressure of $1 \times 10^{-8}$ Torr, oxygen gas in introduced until the oxygen partial pressure is $1 \times 10^{-2}$ Torr, and using an infrared lamp, the temperature is raised by heating at 20° C./minute up to 500° C. (FIG. 3A). At this time, as shown in FIG. 4A, a streaked diffraction pattern can be observed in the RHEED pattern from the $SrTiO_3$<010>direction. Note that the conditions such as the rate of temperature rise, the substrate temperature, and pressure are not limited to the above.

Figure 4B:
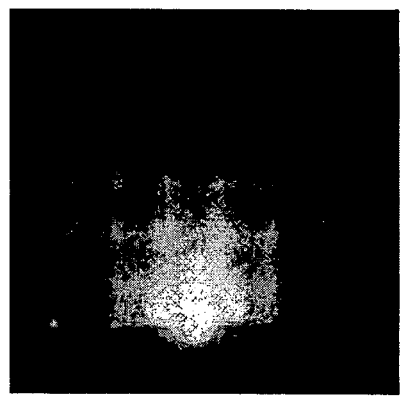
Figure 4C:
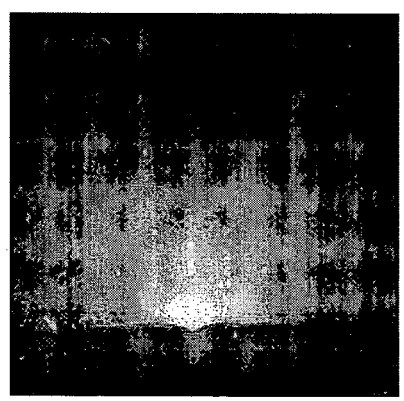

Next, pulsed light from a KrF excimer laser (wavelength 248 nm) was made incident to a $K_{1.2}NbO_x$ target surface, where the laser has an energy density of 2.5 J/cm², a frequency of 1 Hz, and a pulse length of 10 ns, and a plasma plume of K, Nb, and O was generated at the target surface. This plasma plume irradiated the $SrTiO_3$ single crystal substrate 11 at a position separated 40 mm from the target for two minutes, where the substrate temperature was 500° C. and the oxygen partial pressure was $1 \times 10^{-2}$ Torr, and thereby a 2 nm $K_{1.2}NbO_x$ layer 14 was deposited (FIG. 3B). As shown in FIG. 4B, the diffraction pattern disappears from the RHEED pattern from the $SrTiO_3$<010>direction, indicating that the $K_{1.2}NbO_x$ layer 14 was not grown epitaxially. By heating again it to 850° C. at a rate of 20° C./min using the infrared lamp, as shown in FIG. 4C, between 750 and 800° C., a spot pattern appears, and this was unchanged at or above 800° C. That is, it is thought that at or above 800° C., after the $K_{1.2}NbO_x$ is in a state coexisting with the $KNbO_3$ and the liquid phase, the liquid phase almost completely vaporizes (FIG. 3C), and the remaining $KNbO_3$ reacts with the substrate to form a surface consisting of K, Nb, Sr, Ti, and O. Therefore, it was understood that the eutectic temperature at an oxygen partial pressure of $1 \times 10^{-2}$ Torr was between 750 and 800° C.

The following are preferable conditions during irradiation: a laser energy density is equal to or greater than 2 J/cm² and equal to or less than 3 J/cm²; a laser frequency equal to or less than 1 Hz; the distance between the target and substrate is equal to or greater than 30 mm and equal to or less than 50 mm; the substrate temperature is equal to or less than 700° C.; and the oxygen partial pressure during deposition is equal to or greater than $1 \times 10^{-3}$ Torr and equal to or less than $1 \times 10^{-1}$ Torr. However, these conditions are not limiting as long as the K and Nb plasma can reach the substrate sufficiently. Furthermore, as a target, instead of $K_{1.2}NbO_x$, the same effect can be obtained by using a target having a composition from $K_2O:Nb_2O_5=50:50$ to $K_2O:Nb_2O_5=65:35$.

Figure 4D:
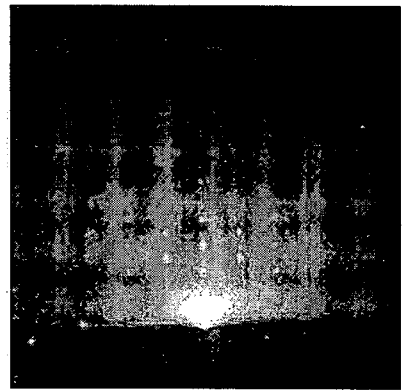

Next, pulsed light from a KrF excimer laser was made incident to a $K_{1.2}NbO_x$ target surface, where the laser has an energy density of 2.5 J/cm², a frequency of 1 Hz, and a pulse length of 10 ns. The generated plasma plume of K, Nb, and O irradiated the $SrTiO_3$ single crystal substrate 11 for 5 minutes at a position separated 40 mm from the target, where the substrate temperature was 800° C. and the oxygen partial pressure was $1 \times 10^{-2}$ Torr, and thereby a 5 nm initial layer 12 consisting of K, Nb, and O was deposited (FIG. 3D). As shown in FIG. 4D, a spot diffraction pattern appears in the RHEED pattern from the $SrTiO_3$<010>direction, indicating that the initial layer 12 was grown epitaxially. Moreover, the following are preferable conditions: a laser energy density is equal to or greater than 2 J/cm² and equal to or less than 3 J/cm²; a laser frequency equal to or less than 1 Hz; the distance between the target and substrate is equal to or greater than 30 mm and equal to or less than 50 mm; the substrate temperature is equal to or greater than 750° C. and equal to or less than 850° C.; and the oxygen partial pressure during deposition is equal to or greater than $1 \times 10^{-3}$ Torr and equal to or less than $1 \times 10^{-1}$ Torr. However, these conditions are not limiting as long as the K and Nb plasma can reach the substrate sufficiently, and the initial layer can be grown epitaxially at a low deposition rate. Furthermore, as a target, instead of $K_{1.2}NbO_x$, the same effect can be obtained by using a target having a composition from $K_2O:Nb_2O_5=50:50$ to $K_2O:Nb_2O_5=65:35$.

Figure 4E:
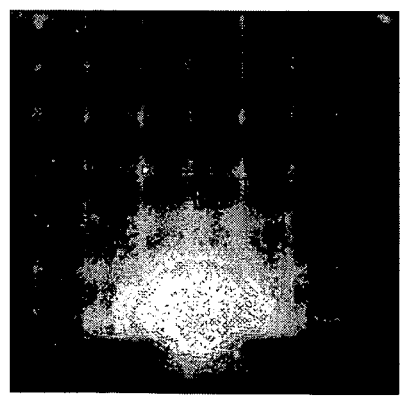

Next, pulsed light from a KrF excimer laser was made incident to a $K_{1.2}NbO_x$ target surface, where the laser has an energy density of 2.5 J/cm², a frequency of 20 Hz, and a pulse length of 10 ns. The plasma plume of K, Nb, and O irradiated the $SrTiO_3$ single crystal substrate 11 at a position separated 40 mm from the target for 60 minutes, where the substrate temperature was 800° C. and the oxygen partial pressure was $1 \times 10^{-2}$ Torr, and thereby a 500 nm $K_{1.2}NbO_x$ layer 15 was deposited. Here, the solid phase and the liquid phase coexisted in the $K_{1.2}NbO_x$ layer 15, and as shown in FIG. 3E, the substrate served as the nucleus for crystal growth, a 400 nm $KNbO_3$ single crystal layer 13 was grown, and a 100 nm liquid phase 16 remained thereon. As shown in FIG. 4E, a clear diffraction pattern such as that in FIG. 4D does not appear in the RHEED pattern from the $SrTiO_3$<010>direction, and it is understood that a liquid phase 16 is present on the surface. Moreover, the following are preferable conditions: a laser energy density is equal to or greater than 2 J/cm² and equal to or less than 3 J/cm²; a laser frequency is equal to or less than 10 Hz; the distance between the target and substrate is equal to or greater than 30 mm and equal to or less than 50 mm; the substrate temperature is equal to or greater than 750° C. and equal to or less than 850° C.; and the oxygen partial pressure during deposition is equal to or greater than $1 \times 10^{-3}$ Torr and equal to or less than $1 \times 10^{-1}$ Torr. However, these conditions are not limiting as long as the K and Nb plasma can reach the substrate sufficiently, and the vapor pressure of the K is high in order to suppress vaporization of K from the substrate. Furthermore, as a target, instead of $K_{1.2}NbO_x$, the same effect can be obtained by using a target having a composition from $K_2O:Nb_2O_5=50:50$ to $K_2O:Nb_2O_5=65:35$.

Figure 4F:
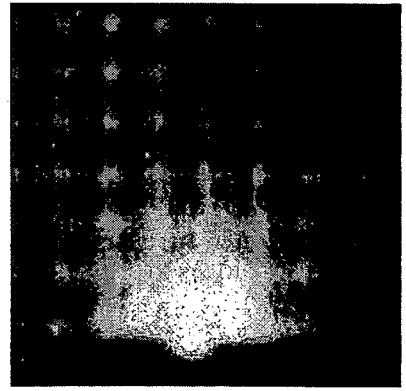
Figure 5A:
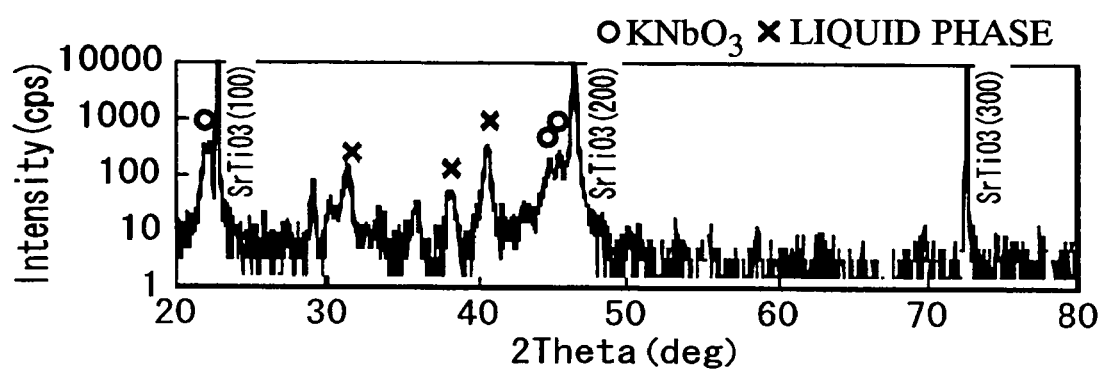
FIG. 5A shows the X-ray diffraction pattern of the $KNbO_3$ single crystal thin film obtained for the case in which the heat treatment step at 850° was not carried out.
Figure 5B:
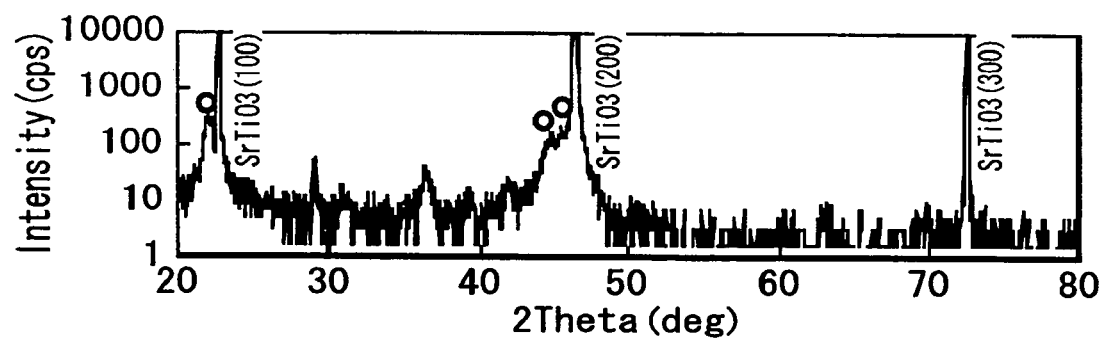
FIG. 5B shows the case in which the heat treatment step was carried out in the first embodiment of the manufacturing method of the potassium niobate single crystal thin film of the present invention.

Next, the substrate was heat treated for 60 minutes, where the substrate temperature was 850° C. and the oxygen partial pressure was $1\times10^{-2}$ Torr. At this time, the liquid phase 16 remaining on the substrate surface was vaporized (FIG. 3F), and as shown in FIG. 4F, the RHEED pattern was more clearly observed. In addition, the X-ray diffraction pattern of the $KNbO_3$ single crystal thin film for which the 850° C. heat treatment step has been omitted is shown in FIG. 5A, while the X-ray diffraction pattern for the $KNbO_3$ single crystal thin film that has undergone the 850° C. heat treatment step is shown in FIG. 5B. However, there are differences in the peak strength of different phases that are not $KNbO_3$, and thus it is clearly possible to obtain a single phase by vaporization of the liquid phase when the heat treatment step is carried out. Moreover, preferably the substrate temperature is equal to or greater than 800° C. and equal to or less than 900° C. and the oxygen partial pressure is equal to or greater than $1\times10^{-3}$ Torr and equal to or less than $1\times10^{-2}$ Torr. However, these conditions are not limiting as long as the liquid phase can evaporate. In addition, besides methods in which the liquid phase is eliminated by vaporization due to heat treatment, the same effect can be obtained by chemically or physically etching or polishing the surface.

Figure 6:
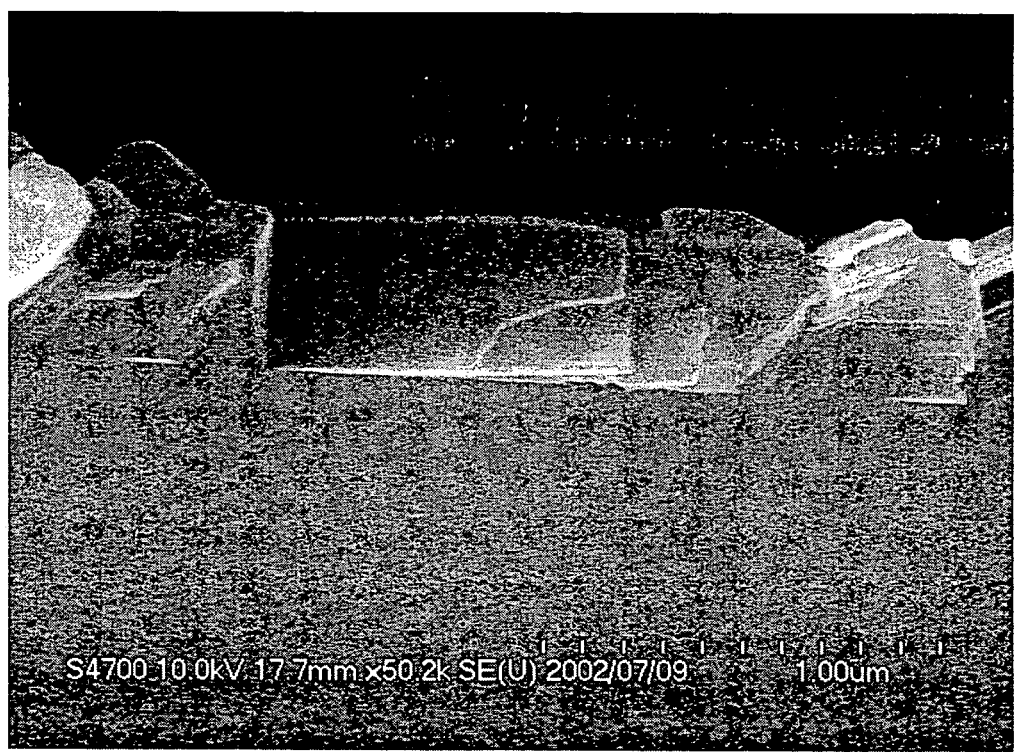
FIG. 6 is a cross-sectional SEM photograph of the thin film obtained in the first embodiment of the manufacturing method for the potassium niobate single crystal thin film of the present invention.

As shown in the cross-sectional SEM photograph in FIG. 6, the obtained film can be observed to have a clearly defined cleavage plane, and thus it can be understood that this is formed from a single crystal of $KNbO_3$. In addition, in combination with the X-ray diffraction results, when $KNbO_3$ and $SrTiO_3$ are respectively represented by orthorhombic or cubic crystal indices, in the direction perpendicular to the film surface, an orientation relationship is obtained wherein $KNbO_3(001)//SrTiO_3(100)$, and in the direction in-plane to the film surface, an orientation relationship is obtained wherein $KNbO_3<110>//SrTiO_3<001>$.

First Embodiment of the Surface Acoustic Wave Element

Figure 7:
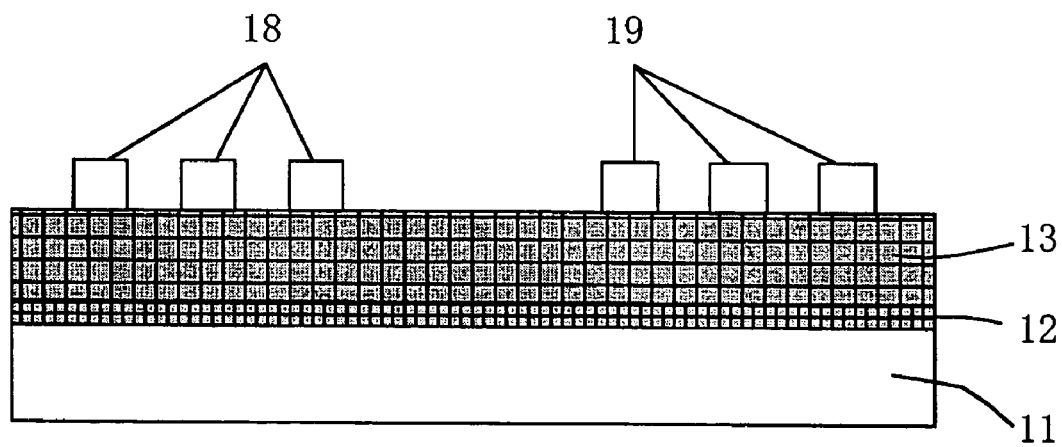
FIG. 7 is a cross-sectional drawing showing the first embodiment of the surface acoustic wave element in the present invention.

FIG. 7 is a cross-sectional drawing showing the first embodiment of the surface acoustic wave element of the present invention.

First, by vacuum deposition using metal aluminum, at a substrate temperature of 25° C., and a vacuum of $5\times10^{-7}$ Torr, a 100 nm Al electrode 17 was deposited on the $KNbO_3$ single crystal layer 13. Note that the substrate temperature, and the vacuum degree are not limited thereby.

Next, a continuous process of patterning using a resist application, light exposure, dry etching, and resist removal was carried out on the Al electrode 17, and the IDT electrodes 18 and 19 were formed on the $KNbO_3$ single crystal layer 13.

The sound velocity of the obtained surface acoustic wave element found from the delay time $V_{open}$ of the surface acoustic wave between the IDT electrodes 18 and 19 was 4000 m/s. From the difference between the delay time $V_{open}$ and the delay time $V_{short}$ of the surface acoustic wave when a metal thin film covered the gap between the IDT electrodes 18 and 19, $k^2$ was 25%. In the case that the $KNbO_3$ single crystal thin film manufacture was not carried out, the sound velocity was the same 4000 mls, but $k^2$ became a low 10%, and it is clear that $k^2$ was improved by making the $KNbO_3$ thin film a single crystal.

In addition, instead of $KNbO_3$, it is possible to obtain the same effect when using a solid $K_{1-x}Na_xNb_{1-y}Ta_yO_3$ ($0 \leq x \leq 1$, $0 \leq y \leq 1$).

Second Embodiment of the Manufacturing Method for the Potassium Niobate Thin Film FIGS. 8A to 8F are cross-sectional diagrams illustrating the second embodiment of the manufacturing method for the potassium niobate single crystal thin film of the present invention.

The potassium niobate single crystal thin film 200 according to the present embodiment consists of an Si single crystal substrate 21, a first buffer layer (a) 22 consisting of YSZ that is grown epitaxially on the Si single crystal substrate 21, a first buffer layer (b) 23 consisting of $CeO_2$ that is grown epitaxially on the first buffer layer (a) 22, a second buffer layer 24 consisting of $YBa_2Cu_3O_x$ that is grown epitaxially on the first buffer layer (b) 23, a third buffer layer 25 consisting of $SrTiO_3$ that is deposited on the second buffer layer 24, an initial layer 26 consisting of K, Nb, and O grown epitaxially on the third buffer layer 25, and a $KNbO_3$ single crystal layer 27 grown epitaxially on the initial layer 26.

Here the surface of the Si single crystal substrate 21 uses a (100) single crystal substrate whose surface is coated by a natural oxide film.

A metal oxide having a NaCl structure or a fluorite structure can be given as metal oxides that can form the first buffer layer (a) 22 and the first buffer layer (b) 23, but among these, in particular, using MgO, CaO, SrO, or BaO, or at least one type among solids that include them, or using YSZ, $CeO_2$, or $ZrO_2$, or at least one type among solids that include them, is preferable. Here, the first buffer layer had a dual structure consisting of the first buffer layer (a) 22 and the first buffer layer (b) 23, and YSZ can be grown epitaxially at a cubic crystal (100) orientation as the first buffer layer (a) 22, and the thickness thereof was 5 nm. In addition, $CeO_2$ can be grown epitaxially in a cubic crystal (100) orientation as the first buffer layer (b) 23, and the thickness thereof was 10 nm. For the second buffer layer 24, here $YBa_2Cu_3O_x$ was grown epitaxially in a tetragonal or an orthorhombic crystal (001) orientation, and the thickness thereof is 2 nm. For the third buffer layer 25, here, $SrTiO_3$ was grown epitaxially in a cubic crystal (100) orientation, and the thickness thereof was 100 nm.

Here, in the case of using a metal oxide having an NaCl structure such as MgO as the first buffer layer, $SrTiO_3$ can be grown epitaxially in a cubic crystal (100) orientation as the second buffer layer, to produce a structure without a third buffer layer.

The initial layer 26 is an interface layer in which the structure transitions from $SrTiO_3$ to $KNbO_3$, and while the structure and composition are not limited, $SrTiO_3$ can be grown epitaxially on the third buffer layer 25, and the thickness thereof is 5 nm. For the $KNbO_3$ single crystal layer 27, here a $KNbO_3$ single crystal was grown epitaxially in an orthorhombic crystal (001) orientation or an orthorhombic crystal (110) orientation, and the thickness thereof was 400 nm.

Next, the manufacturing method of the potassium niobate single crystal thin film described above will be explained.

Figure 8A:
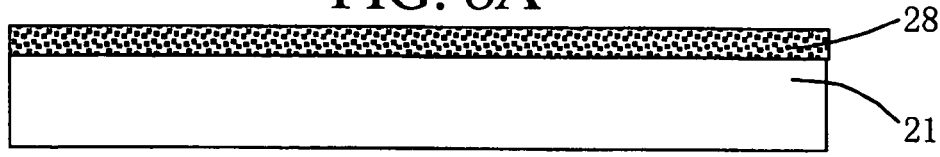
FIGS. 8A to 8F are cross-sectional drawings showing a second embodiment of the manufacturing method for the potassium niobate single crystal thin film of the present invention.

The Si substrate 21 is immersed in an organic solvent, and degreasing and cleaning was carried out using an ultrasound cleaning device. Here, for example, a 1:1 liquid mixture of ethyl alcohol and acetone can be used as the organic solvent, but the above is not limiting. In addition, it is not necessary to carry out a step using RCA cleaning or hydrofluoric acid cleaning, which are typical representative cleaning methods for a Si substrate, to remove the natural oxide film. As a result, as shown in FIG. 8A, a natural oxide film 28 formed on the surface of the Si substrate 21.

After the Si substrates 21 that have undergone degreasing and cleaning were mounted on substrate holders, each substrate holder was introduced into a vacuum apparatus at a negative pressure of $1\times10^{-8}$ Torr, and using an infrared lamp, the temperature was raised by heating at 10°/minute up to 700°. During the temperature rise, in the temperature region equal to or greater than 500° C., a part of the natural oxide layer vaporized as SiO, and thus the pressure rose to equal to or greater than $1\times10^{-6}$ Torr. However, at 700° C., the pressure becomes a constant value equal to or less than $5\times10^{-7}$ Torr. However, a diffraction pattern cannot be observed in the RHEED pattern from the Si<011>direction, which means that the surface reconstructed by Si(100)2×1 did not form. It can thus be understood that the Si substrate was covered by the natural oxide film 28. Moreover, the conditions of the rate of temperature rise, the substrate temperature, the pressure and the like are not limited as long as they are in a range in which a new heat oxide film does not form on the Si substrate surface.

Figure 8B:
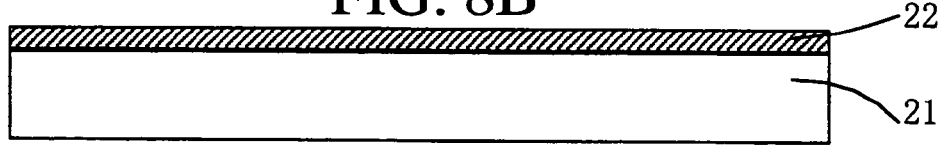

After the pressure became constant, pulsed light of a KrF excimer laser was made incident to the YSZ target surface disposed opposite to the Si substrate 21, where the laser had an energy density of 2.5 J/cm$^2$, a frequency of 10 Hz, and the pulse length of 10 ns, and a plasma plume consisting of Y, Zr, and O was generated at the target surface. This plasma plume irradiated the Si(100) substrate 21, which was at a position separated 40 mm from the target, and a 5 nm YSZ first buffer layer (a) 22 was deposited by irradiating the substrate for 10 minutes, where the substrate temperature was 700° C. and the oxygen partial pressure during deposition was $5\times10^{-5}$ Torr (FIG. 8B). A streaked diffraction pattern appeared in the RHEED pattern from the Si<011>direction, indicating that the YSZ buffer layer 22 has grown epitaxially. Note that the following conditions are preferable: the target composition is YSZ; the laser energy density is equal to or greater than 2 J/cm$^2$ and equal to or less than 3 J/cm$^2$; the laser frequency is equal to or greater than 5 Hz and equal to or less than 15 Hz; the distance between the target and substrate is equal to or greater than 30 mm and equal to or less than 50 mm; the substrate temperature is equal to or greater than 650° C. and equal to or less than 750° C.; and the oxygen partial pressure during deposition is equal to or greater than $1\times10^{-5}$ Torr and equal to or less than $1\times10^{-4}$ Torr. However, the invention is not limited by the above as long as the Y and Zr plasma can selectively reach the substrate and YSZ can be grown epitaxially while removing the natural oxide film on the substrate as SiO. However, depending on the conditions, although the YSZ first buffer (a) 22 does not change, there may be cases in which oxygen is supplied and an oxide film is formed at the interface between the Si substrate 21 and the YSZ first buffer (a) 22. Furthermore, if the ZrO$_2$ forms a solid as a cubic crystal, instead of Y, the same effect can be obtained by doping with La, Ce, Pr, Nd, Pm, Sm, Eu, Gd, Th, Dy, Ho, Er, Tm, Yb, Lu, Mg, Ca, Sr, or Ba.

After depositing the YSZ first buffer (a) 22, pulsed light of a KrF excimer laser was made incident to the CeO$_2$ target surface disposed opposite to the substrate, where the laser has an energy density of 2.5 J/cm$^2$k, a frequency of 10 Hz, and a pulse length of 10 ns. A Ce and O plasma plume was generated at the target surface. The plasma plume irradiated the Si substrate 21 at a position separated 40 mm from the target, and a 10 nm CeO$_2$ first buffer layer (b) 23 was deposited by irradiating the substrate for 10 minutes, where the substrate temperature was 700° C. and the oxygen partial pressure during deposition was $5\times10^{-5}$ Torr. A spot diffraction pattern appeared in the RHEED pattern from the Si<011>direction, indicating that the CeO$_2$ first buffer layer 23 has been grown epitaxially. Note that the following conditions are preferable: the target composition is CeO$_2$; the laser energy density is equal to or greater than 2 J/cm$^2$ and equal to or less than 3 J/cm$^2$; the laser frequency is equal to or greater than 5 Hz and equal to or less than 15 Hz; the distance between the target and substrate is equal to or greater than 30 mm and equal to or less than 50 mm; the substrate temperature is equal to or greater than 650° C. and equal to or less than 750° C.; and the oxygen partial pressure during deposition is equal to or greater than $1\times10^{-5}$ Torr and equal to or less than $1\times10^{-4}$ Torr. However, the conditions are not limited by the above as long as CeO$_2$ can be grown epitaxially. Furthermore, if the CeO$_2$ forms a solid as a cubic crystal, the same effect can be obtained by doping with Pr or Zr.

After the CeO$_2$ first buffer layer (b) 23 was deposited, a KrF excimer laser was made incident to the YBa$_2$Cu$_3$O$_x$ target surface disposed opposite to the substrate, where the laser had an energy density of 2.5 J/cm$^2$, a frequency of 5 Hz, and a pulse length of 10 ns. A plasma plume of Y, Ba, Cu, and O was generated at the target surface. This plasma plume irradiated the Si substrate 21 positioned separated from the target by 40 mm, and a 2 nm YBa$_2$Cu$_3$O$_x$ second buffer layer 24 was deposited by irradiating the substrate for 2 minutes, where the substrate temperature was 600° C. and the oxygen partial pressure during deposition was $1\times10^{-2}$ Torr. A streaked diffraction pattern appeared in the RHEED pattern from the Si<011>direction, indicating that the YBa$_2$Cu$_3$O$_x$ second buffer layer 24 was grown epitaxially. Note that the following conditions are preferable: the target composition is YBa$_2$Cu$_3$O$_x$; the laser energy density is equal to or greater than 2 J/cm$^2$ and equal to or less than 3 J/cm$^2$; the laser frequency is equal to or greater than 2 Hz and equal to or less than 10 Hz; the distance between the target and substrate is equal to or greater than 30 mm and equal to or less than 50 mm; the substrate temperature is equal to or greater than 550° C. and equal to or less than 650° C.; and the oxygen partial pressure during deposition is equal to or greater than $1\times10^{-3}$ Torr and equal to or less than $1\times10^{-1}$ Torr. However, the conditions are not limited by the above as long as the Y, Ba, Cu plasma can reach the substrate at a 1:2:3 ratio and the YBa$_2$Cu$_3$O$_x$ is grown epitaxially. In addition, instead of YBa$_2$Cu$_3$O$_x$, the same effects can be obtained by a solid body of M$_2$RuO$_4$ (M=Ca, Sr, Ba), RE$_2$NiO$_4$ (RE=La, Ce, Pr, Nd, Pm, Sm, Eu, Gd, Th, Dy, Ho, Er, Tm, Yb, Lu, Y) and NiO, REBa$_2$Cu$_3$O$_x$ (RE=La, Ce, Pr, Nd, Pm, Sm, Eu, Gd, Th, Dy, Ho, Er, Tm, Yb, Lu), or (Bi, RE)$_4$Ti$_3$O$_{12}$ (RE=La, Ce, Pr, Nd, Pm, Sm, Eu, Gd, Th, Dy, Ho, Er, Tm, Yb, Lu, Y).

Figure 8C:
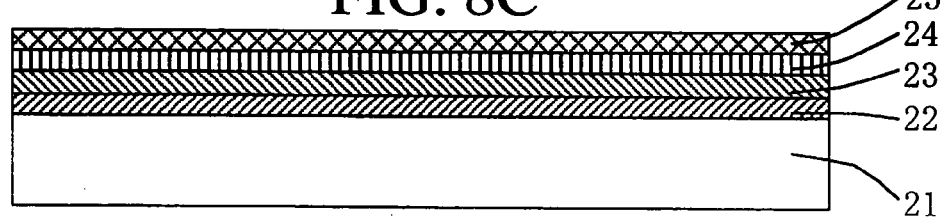

After deposition of the YBa$_2$Cu$_3$O$_x$ second buffer layer 24, pulsed light of a KrF excimer laser was made incident to the SrTiO$_3$ target surface disposed opposite to the substrate, where the laser has an energy density of 2.5 J/cm$^2$, a frequency of 5 Hz, and a pulse length of 10 ns, and a plasma plume of Sr, Ti, and O was generated at the target surface. This plasma plume was irradiated on the Si substrate 21 positioned separated 40 mm from the target, and a 100 nm SrTiO$_3$ third buffer layer 25 was deposited by irradiating the Si substrate 21 for 30 minutes, where the substrate temperature was 600° C. and the oxygen partial pressure during deposition was $1\times10^{-2}$ Torr (FIG. 8C). A spot diffraction pattern appeared in the RHEED pattern from the Si<011>direction, indicating that the third buffer layer 25 was grown epitaxially. Note that the following conditions are preferable: the target composition is SrTiO$_3$; the laser energy density is equal to or greater than 2 J/cm$^2$ and equal to or less than 3 J/cm$^2$; the laser frequency is equal to or greater than 2 Hz and equal to or less than 10 Hz; the distance between the target and substrate is equal to or greater than 30 mm and equal to or less than 50 mm; the substrate temperature is equal to or greater than 550° C. and equal to or less than 650° C.; and the oxygen partial pressure during deposition is equal to or greater than $1\times10^{-3}$ Torr and equal to or less than $1\times10^{-1}$ Torr. However, the conditions are not limited by the above as long as the Sr and Ti reach the substrate in a 1:1 ratio and the $SrTiO_3$ can be grown epitaxially. In addition, instead of $SrTiO_3$, the same effects can be obtained by $MTiO_3$ (M=Ca, Ba), (RE, M) $AlO_3$ (RE=La, Ce, Pr, Nd, Pm, Sm, Eu, Gd, Tb, Dy, Ho, Er, Tm, Tb, Lu, Y, M=Mg, Ca, Sr, Ba), or $REGaO_3$ (RE=La, Ce, Pr, Nd, Pm, Sm, Eu, Gd, Tb, Dy, Ho, Er, Tm, Yb, Lu, Y).

Figure 8D:
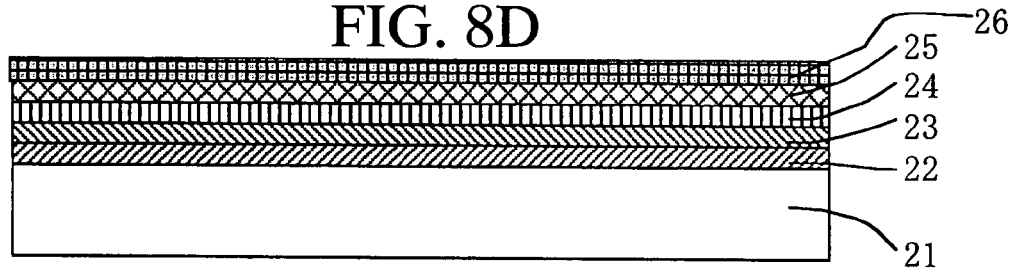

Next, the pulsed light of a KrF excimer laser was made incident to a $K_{1.2}NbO_x$ target surface, where the laser has an energy density of 2.5 J/cm², a frequency of 1 Hz, and a pulse length of 10 ns. The generated plasma plume of N, Nb, and O irradiated the Si substrate 21 positioned separated 40 mm from the target for 5 minutes, where the substrate temperature was 800° C. and the oxygen partial pressure was $1\times10^{-2}$ Torr, and a 5 nm initial layer 26 consisting of K, Nb, and O was deposited (FIG. 8D). A spot diffusion pattern appeared in the RHEED pattern from the Si<011>direction, indicating that the initial layer 26 was grown epitaxially. Note that the following conditions are preferable: the laser energy density is equal to or greater than 2 J/cm² and equal to or less than 3 J/cm²; the laser frequency is equal to or greater than 1 Hz; the distance between the target and substrate is equal to or greater than 30 mm and equal to or less than 50 mm; the substrate temperature is equal to or greater than 750° C. and equal to or less than 850° C.; and the oxygen partial pressure during deposition is equal to or greater than $1\times10^{-3}$ Torr and equal to or less than $1\times10^{-1}$ Torr. However, the conditions are not limited thereby as long as the K, Nb plasma can reach the substrate sufficiently and the initial layer grown epitaxially. Furthermore, as a target, instead of $K_{1.2}NbO_x$, the same effect can be obtained by using a target having a composition from $K_2O:Nb_2O_5=50:50$ to $K_2O:Nb_2O_5=65:35$.

Figure 8E:
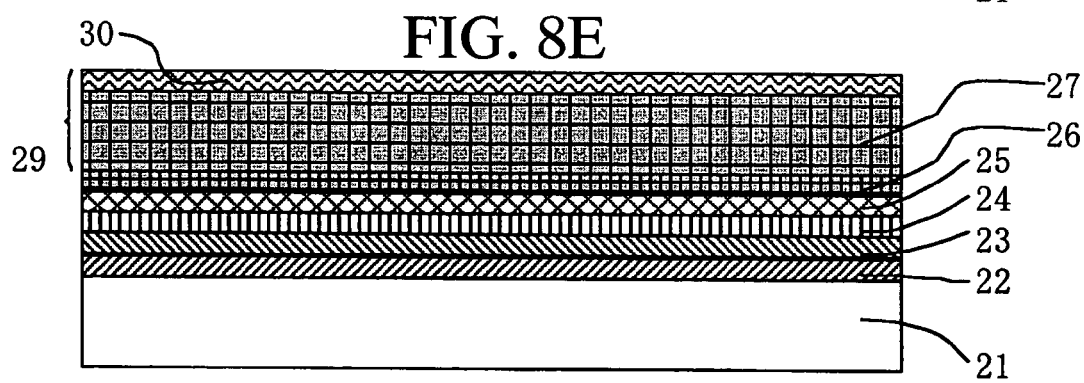
Figure 8F:
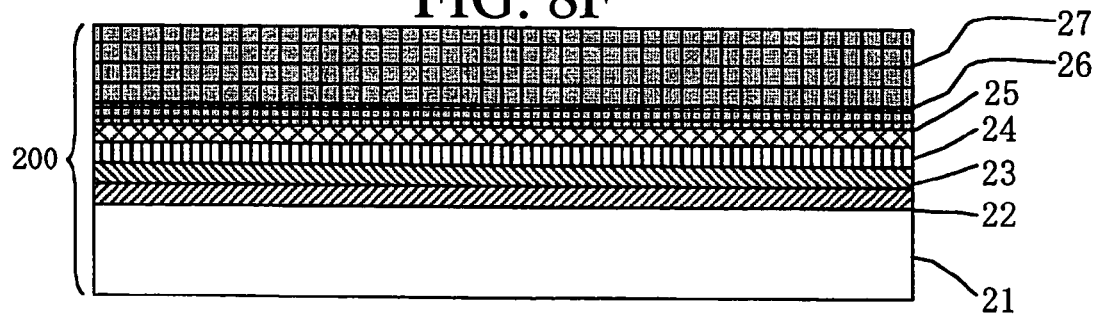

Next, the pulsed light of a KrF excimer laser was made incident to the $K_{1.2}NbO_x$ target surface, where the laser has an energy density of 2.5 J/cm², a frequency of 20 Hz, and a pulse length of 10 ns. A plasma plume of K, Nb, and O irradiated the Si substrate 21 positioned separated 40 mm from the target for 60 minutes, where the substrate temperature was 800° C. and the oxygen partial pressure was $1\times10^{-2}$ Torr, and a 500 nm $K_{1.2}NbO_x$ layer 29 was deposited (FIG. 8E). Here, in the $K_{1.2}NbO_x$ layer 29, the solid phase and liquid phase coexist, and a 400 nm $KNbO_3$ single crystal layer 27 was formed using the substrate as the nucleus of the crystal growth, and a 100 nm liquid phase remained thereon. A spot diffraction pattern appeared in the RHEED pattern from the Si<011>direction, indicating that the $KNbO_3$ single crystal layer was grown epitaxially. Note that the following conditions are preferable: the laser energy density is equal to or greater than 2 J/cm² and equal to or less than 3 J/cm²; the laser frequency is equal to or greater than 10 Hz; the distance between the target and substrate is equal to or greater than 30 mm and equal to or less than 50 mm; the substrate temperature is equal to or greater than 750° C. and equal to or less than 850° C.; and the oxygen partial pressure during deposition is equal to or greater than $1\times10^{-3}$ Torr and equal to or less than $1\times10^{-1}$ Torr. However, the conditions are not limited thereby as long as the K, Nb plasma can reach the substrate sufficiently and it is possible to suppress the vaporization of K from the substrate by making the vapor pressure of K high. Furthermore, as a target, instead of $K_{1.2}NbO_x$, the same effect can be attained by a target having a composition from $K_2O:Nb_2O_5=50:50$ to $K_2O:Nb_2O_5=65:35$.

Next, at a substrate temperature of 850° C. and an oxygen partial pressure of $1\times10^{-2}$ Torr, the substrate was heat treated for 60 minutes. At this time, the liquid phase 30 that remained on the substrate surface was vaporized (FIG. 8F), and this can be clearly observed in the RHEED pattern. After a subsequent cooling process, from the results of the X-ray diffraction pattern of the obtained $KNbO_3$ single crystal thin film, there was a difference in the peak strength of different phases that was not the $KNbO_3$, and it is clear that by vaporization of the liquid phase during the heat treatment step, a single phase can be obtained. Moreover, the preferable conditions are: a substrate temperature equal to or greater than 800° C. and equal to or less than 900° C. and an oxygen partial pressure equal to or greater than $1\times10^{-3}$ Torr and equal to or less than $1\times10^{-1}$ Torr. However, these conditions are not limited thereby as long as the liquid phase can vaporize. In addition, instead of a method in which the liquid phase is removed by vaporization using a heat treatment, the same effect can be obtained by chemically or physically etching or polishing the surface.

When combined with the results of X-ray diffraction, if $KNbO_3$, $SrTiO_3$, $YBa_2Cu_3O_x$, $CeO_2$, YSZ, and Si are respectively represented by indices for an orthorhombic crystal, a cubic crystal, tetragonal crystal, a cubic crystal, a cubic crystal, and a cubic crystal, the obtained film has the orientation relationships in a direction perpendicular to the film surface of $KNbO_3(001)/SrTiO_3(100)/YBa_2Cu_3O_x(001)/CeO_2(100)/YSZ(100)/Si(100)$, and in-plane orientation relationships to the film surface of $KNbO_3(110)/SrTiO_3<010>//YBa_2Cu_3O_x<100>//CeO_2<011>//YSZ<011>//Si<011>$.

Second Embodiment of the Surface Acoustic Wave Element

Figure 9:
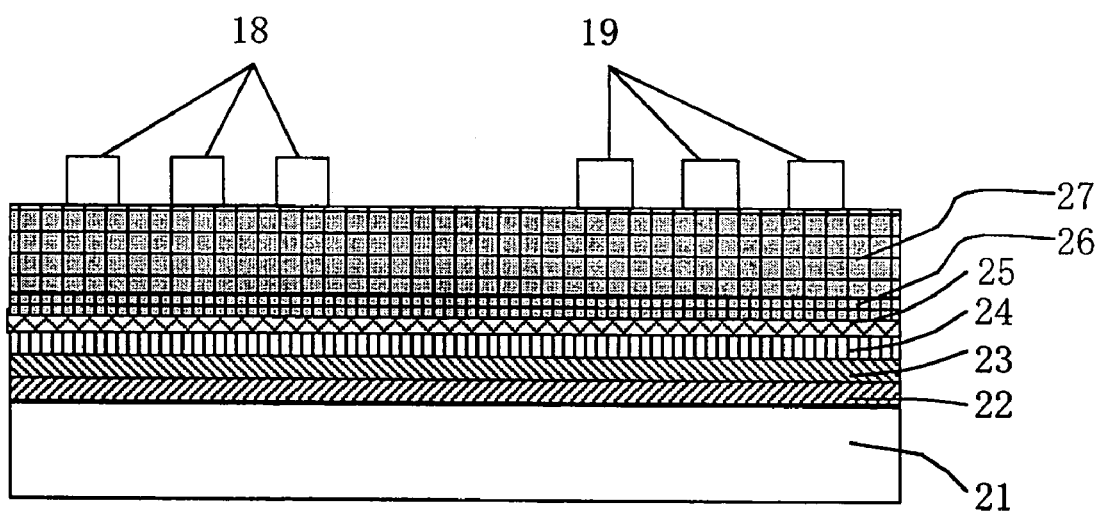
FIG. 9 is a cross-sectional drawing showing a second embodiment of the surface acoustic wave element of the present invention.

FIG. 9 is a cross-sectional diagram showing the second embodiment of the surface acoustic wave element of the present invention.

IDT electrodes 18 and 19 are formed on the $KNbO_3$ single crystal layer 27 completely identically to the first embodiment of the surface acoustic wave element.

The sound velocity of the obtained surface acoustic wave element found from the delay time $V_{open}$ of the surface acoustic wave between the IDT electrodes 18 and 19 was 5000 m/s. From the difference between the delay time $V_{open}$ and the delay time $V_{short}$ of the surface acoustic wave when a metal thin film covered the gap between the IDT electrodes 18 and 19, $k^2$ was 20%. In the case that the $KNbO_3$ single crystal thin film manufacture was not carried out, the sound velocity was the same 5000 m/s, but $k^2$ became a low 8%, and it is clear that $k^2$ was improved by making the $KNbO_3$ thin film a single crystal.

In addition, instead of $KNbO_3$, the same effect can be obtained by using $K_{1-x}Na_xNb_{1-y}Ta_yO_3$ ($0 \leq x \leq 1$, $0 \leq y \leq 1$).

Third Embodiment of the Manufacturing Method for the Potassium Niobate Thin Film FIG. 10 is a cross-sectional drawing illustrating the third embodiment of the manufacturing method for the potassium niobate single crystal thin film of the present invention.

The potassium niobate single crystal thin film 300 of the present embodiment consists of a substrate 31, a first buffer layer 32 consisting of MgO that is grown oriented in-plane to the substrate 31, a second buffer layer 33 consisting of $SrTiO_3$ deposited on the first buffer layer 32, an initial layer 34 consisting of K, Nb, and O grown epitaxially on the second buffer layer 32, and a KNbO$_3$ single crystal layer 35 grown epitaxially on the initial layer 34.

When and Si substrate and an SOI substrate are used, a substrate 31 can be used whose surface is covered by a natural oxide film, or a ceramic substrate such as a polycrystal YSZ substrate can be used, or a substrate that is entirely amorphous such as a glass substrate can also be used. By using such a general-purpose substrate, it is possible to reduce the manufacturing cost of the surface acoustic wave element described below. In addition, a single crystal substrate having a crystal structure such that a perovskite-type oxide compound cannot be grown epitaxially can be used. Here, a quartz substrate was used as the surface acoustic wave element substrate.

A metal oxide having an NaCl structure or a fluorite structure can be given as metal compounds that form the first buffer layer 32. Among these, in particular, MgO, CaO, SrO, or BaO, or at least one type among solids that include these, or YSZ, CeO$_2$, ZrO$_2$, or at least one type among the solids of these, is preferably used. Furthermore, the first buffer layer 32 is grown oriented in-plane, but this direction can be arbitrarily set by changing the irradiation direction of a irradiating argon ion beam during the buffer layer deposition. Here, the MgO was grown oriented in-plane at a cubic crystal (100) orientation as the first buffer layer 32, and the thickness thereof was 10 nm. For the second buffer layer 33, here SrTiO$_3$ was grown epitaxially in a cubic crystal (100) orientation, and had a thickness of 100 nm.

Here, in the case of using a metal compound having a fluorite structure such as YSZ or YSZ/CeO$_2$ as the first buffer layer, a structure can be used in which a metal compound having a layered perovskite structure such as YBa$_2$Cu$_3$O$_x$ is grown epitaxially at a tetragonal or orthorhombic crystal (001) orientation as the second buffer layer, and then SrTiO$_3$ is grown epitaxially thereon at a cubic crystal (100) orientation as the third buffer layer.

The initial layer 34 is an interface layer in which the structure transitions from SrTiO$_3$ to KNbO$_3$, and while the structure and composition are not limited thereby, the KNbO$_3$ can be grown epitaxially on the SrTiO$_3$ substrate 11, and has a thickness of 5 nm. In the KNbO$_3$ single crystal layer 35, here the KNbO$_3$ single crystal thin film was grown epitaxially in an orthorhombic crystal (001) orientation or a orthorhombic crystal (110) orientation.

Next, the manufacturing method of the potassium niobate single crystal thin film will be explained.

The quartz substrate 31 was immersed in an organic solvent, and degreasing and cleaning was carried out using an ultrasound cleaning device. Here, for example, a 1:1 liquid mixture of ethyl alcohol and acetone can be used as the organic solvent, but the present invention is not limited by the above.

Figure 10A:
FIG. 10 is a cross-sectional drawing showing a third embodiment of the manufacturing method for the potassium niobate single crystal thin film of the present invention.

After the quartz substrates 31 that have undergone degreasing and cleaning were mounted in substrate holders, the substrate holders were each introduced into a vacuum apparatus having a negative pressure of 1×10$^{-6}$ Torr at room temperature, and a mixed gas such as argon:oxygen=100:1 at a pressure of 1×10$^{-4}$ Torr was introduced (FIG. 10A). Moreover, the condition of the pressure is not limited by the above.

Figure 10B:

First, the pulsed light of a KrF excimer laser was made incident to the Mg target surface disposed opposite to the substrate, where the laser has an energy density of 2.5 J/cm$^2$, a frequency of 10 Hz, and a pulse length of 10 ns, and a plasma plume of Mg was generated at the target surface. The plasma plume irradiated the quartz substrate 31 positioned separated by 40 mm from the target, where the substrate temperature was 50° C. and the pressure during deposition was 1×10$^{-4}$ Torr, and the substrate was irradiated for 10 minutes to deposit a 10 nm MgO first buffer layer 32 on the substrate (FIG. 10B). At this time, an argon ion bream irradiates the quartz substrate 31 from a direction 45° from normal incidence to the substrate. Here, preferably a Kauffmann ion source is used as the source, and the acceleration voltage of the ion beam is about 200 eV and the current is about 10 mA. Rather than carrying out heating of the substrate by a heater, the substrate temperature was raised 50 to 70° by the bombardment of the argon ion beam. A spot diffraction pattern appears in the RHEED pattern, indicating that the MgO first buffer layer 32 has been formed. Moreover, the following are preferable conditions: a laser energy density is equal to or greater than 2 J/cm$^2$ and equal to or less than 3 J/cm$^2$; a laser frequency equal to or greater than 5 Hz and equal to or less than 15Hz; the distance between the target and substrate is equal to or greater than 30 mm and equal to or less than 50 mm; and the oxygen partial pressure during deposition is equal to or greater than 1×10$^{-5}$ Torr and equal to or less than 1×10$^{-4}$ Torr. However, these conditions are not limiting as long as MgO can be grown in the in-plane orientation.

Figure 10C:
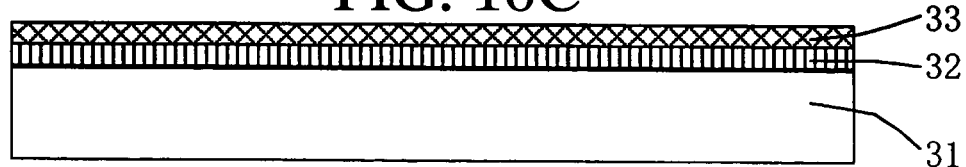

After depositing the MgO first buffer layer 32, the pulsed light of a KrF excimer laser was made incident to the SrTiO$_3$ target surface disposed opposite to the substrate, where the laser has an energy density of 2.5 J/cm$^2$, a frequency of 5Hz, and a pulse length of 10 ns, and thereby a Sr, Ti, and O plasma plume was generated at the target surface. This plasma plume irradiated the quartz substrate 31 positioned separated 40 mm from the target, where the substrate temperature is 600° C. and the oxygen partial pressure during deposition is 1×10$^{-2}$ Torr. The substrate was irradiated 30 minutes to deposit a 100 nm SrTiO$_3$ second buffer layer 33 (FIG. 10C). A spot diffraction pattern appears in the RHEED pattern, indicating that the SrTiO$_3$ second buffer layer 33 has been grown epitaxially. Moreover, the following are preferable conditions during irradiation: the laser energy density is equal to or greater than 2 J/cm$^2$ and equal to or less than 3 J/cm$^2$; the laser frequency is equal to or greater than 2 Hz and equal to or less than 10 Hz; the distance between the target and substrate is equal to or greater than 30 mm and equal to or less than 50 mm; the substrate temperature is equal to or greater than 550° C. and equal to or less than 650° C.; and the oxygen partial pressure during deposition is equal to or greater than 1×10$^{-3}$ Torr and equal to or less than 1×10$^{-1}$ Torr. However, these conditions are not limiting as long as the Sr and Ti plasma arrives at the substrate in a 1:1 ratio and the SrTiO$_3$ can be grown epitaxially. In addition, instead of SrTiO$_3$, the same effects can be obtained by MTiO$_3$ (M=Ca, Ba), (RE, M) AlO$_3$ (RE=La, Ce, Pr, Nd, Pm, Sm, Eu, Gd, Th, Dy, Ho, Er, Tm, Yb, Lu, Y, M=Mg, Ca, Sr, Ba), or REGaO$_3$ (RE=La, Ce, Pr, Nd, Pm, Sm, Eu, Gd, Th, Dy, Ho, Er, Tm, Yb, Lu, Y).

Figure 10D:
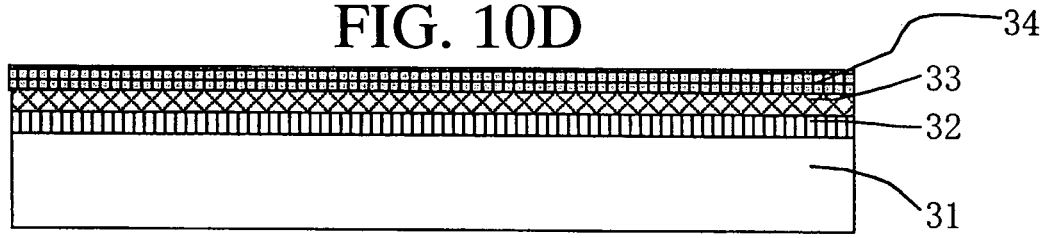

Next, the pulsed light of a KrF excimer laser was made incident to the K$_{1.2}$NbO$_x$ target surface, where the laser has an energy density of 2.5 J/cm$^2$, a frequency of 1 Hz, and a pulse length of 10 ns. The generated K, Nb, and O plasma plume irradiated the quartz substrate 31 positioned separated 40 mm from the target for 5 minutes, where the substrate temperature was 800° C. and the oxygen partial pressure was 1×10$^{-2}$ Torr, to deposit a 5 nm initial layer 34 consisting of K, Nb, and O (FIG. 10D). A spot diffraction pattern appeared in the RHEED pattern, indicating that the initial layer 34 was grown epitaxially. Moreover, the following are preferable conditions during irradiation: a laser energy density is equal to or greater than 2 J/cm$^2$ and equal to or less than 3 J/cm$^2$;

a laser frequency equal to or less than 1 Hz; the distance between the target and substrate is equal to or greater than 30 mm and equal to or less than 50 mm; the substrate temperature is equal to or greater than 750° C. and equal to or less than 850° C.; and the oxygen partial pressure during deposition is equal to or greater than $1\times10^{-3}$ Torr and equal to or less than $1\times10^{-1}$ Torr. However, these conditions are not limiting as long as the K and Nb plasma can sufficiently reach the substrate and the initial layer can be grown epitaxially. Furthermore, as a target, instead of $K_{1.2}NbO_x$, the same effect can be obtained by using a target having a composition from $K_2O:Nb_2O_5=50:50$ to $K_2O:Nb_2O_5=65:35$.

Figure 10E:
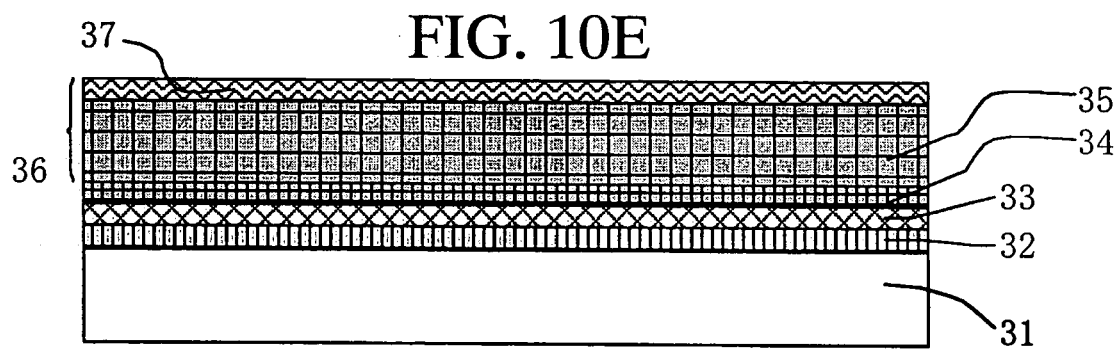
Figure 10F:
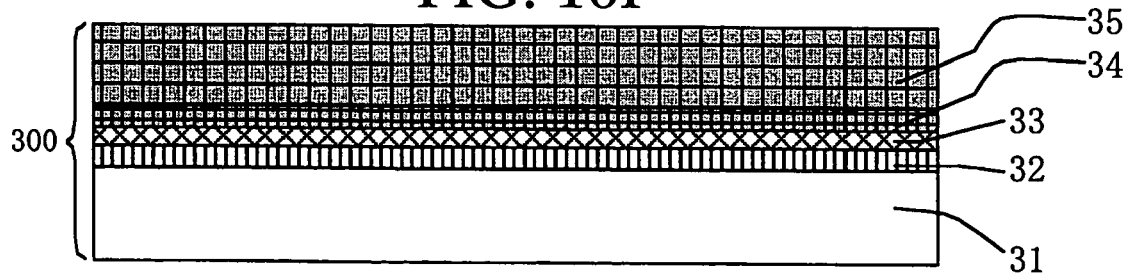

Next, the pulsed light of a KrF excimer laser was made incident to the $K_{1.2}NbO_x$ target surface, where the laser has an energy density of 2.5 J/cm$^2$, a frequency of 20 Hz, and a pulse length of 10 ns. The generated K, Nb, and O plasma plume irradiated the quartz substrate 31 positioned separated 40 mm from the target for 60 minutes, where the substrate temperature was 800° C. and the oxygen partial pressure was $1\times10^{-2}$ Torr, to deposit a 500 nm $K_{1.2}NbO_x$ layer 36 (FIG. 10E). Here, the solid phase and liquid phase coexist in the $K_{1.2}NbO_x$ layer 36, and using the substrate as the nucleus of the crystal growth, a 400 nm $KNbO_3$ single crystal layer 35 was grown, and a 100 nm liquid phase 37 remained thereon. A streak diffraction pattern appeared in the RHEED pattern, indicating that the $KNbO_3$ single crystal layer 35 was grown epitaxially. Moreover, the following are preferable conditions during irradiation: a laser energy density is equal to or greater than 2 J/cm$^2$ and equal to or less than 3 J/cm$^2$; a laser frequency equal to or less than 10 Hz; the distance between the target and substrate is equal to or greater than 30 mm and equal to or less than 50 mm; the substrate temperature is equal to or greater than 750° C. and equal to or less than 850° C.; and the oxygen partial pressure during deposition is equal to or greater than $1\times10^{-3}$ Torr and equal to or less than $1\times10^{-1}$ Torr. However, these conditions are not limiting as long as the K and Nb plasma can sufficiently reach the substrate and the vaporization of K from the substrate can be suppressed by making the vapor pressure of K high. Furthermore, as a target, instead of $K_{1.2}NbO_x$, the same effect can be attained by using a target having a composition from $K_2O:Nb_2O_5=50:50$ to $K_2O:Nb_2O_5=65:35$.

Next, the substrate was heat treated for 60 minutes, where the substrate temperature was 850° C. and the oxygen partial pressure was $1\times10^{-2}$ Torr. At this time, the liquid phase 37 remaining on the substrate surface vaporized (FIG. 10F), and the RHEED pattern can be observed to be more defined. From the results of the X-ray diffraction pattern of the $KNbO_3$ single crystal thin film obtained after a cooling process, there is a difference in the peak strength of the different phases that are not $KNbO_3$, and it is clear that a single phase can be attained by vaporizing the liquid phase during the heat treatment step. Moreover, preferably the substrate temperature is equal to or greater than 800° C. and equal to or less than 900° C. and the oxygen partial pressure is equal to or greater than $1\times10^{-3}$ Torr and equal to or less than $1\times10^{-1}$ Torr. However, these conditions are not limiting as long as the liquid phase can be vaporized. In addition, besides a method of eliminating the liquid phase by vaporization using a heat treatment, the same effect can be obtained by chemically or physically etching or polishing the surface.

In addition, in combination with the X-ray diffraction results, when $KNbO_3$ and $SrTiO_3$ are respectively represented by orthorhombic or cubic crystal indices, the obtained thin film has orientation relationship in which, in the direction perpendicular to the film surface, $KNbO_3(001)/SrTiO_3(100)/MgO(100)$, and in the direction in-plane to the film surface, an orientation relationship is obtained wherein $KNbO_3<110>//SrTiO_3<010>//MgO<010>$.

Third Embodiment of the Surface Acoustic Wave Element

Figure 11:
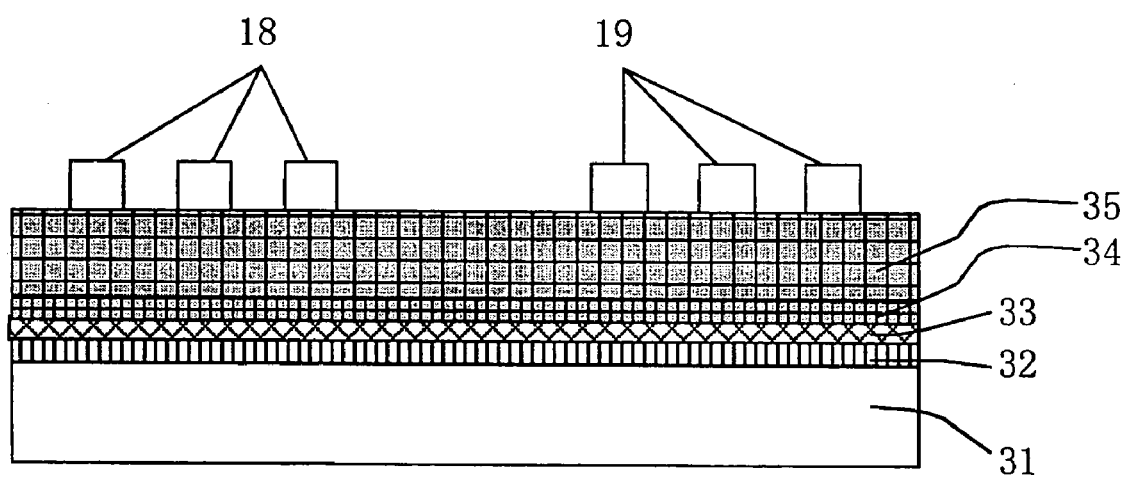
FIG. 11 is a cross-sectional drawing showing a third embodiment of the surface acoustic wave element of the present invention.

FIG. 11 is a cross-sectional drawing of the third embodiment of the surface acoustic wave element of the present invention.

IDT electrodes 18 and 19 are formed on the $KNbO_3$ single crystal layer 35 completely identically to the first embodiment of the surface acoustic wave element.

The sound velocity of the obtained surface acoustic wave element found from the delay time $V_{open}$ of the surface acoustic wave between the IDT electrodes 18 and 19 was 3000 m/s. From the difference between the delay time $V_{open}$ and the delay time $V_{short}$ of the surface acoustic wave when a metal thin film covered the gap between the IDT electrodes 18 and 19, $k^2$ was 15%. In the case that the $KNbO_3$ single crystal thin film manufacture was not carried out, the sound velocity was the same 3000 m/s, but $k^2$ became a low 5%, and it is clear that $k^2$ was improved by making the $KNbO_3$ thin film a single crystal.

In addition, instead of $KNbO_3$, it is possible to obtain the same effect when using a solid $K_{1-x}Na_xNb_{1-y}Ta_yO_3$ ($0\leq x \leq 1$, $0\leq y \leq 1$).

Frequency Filter

Figure 12:
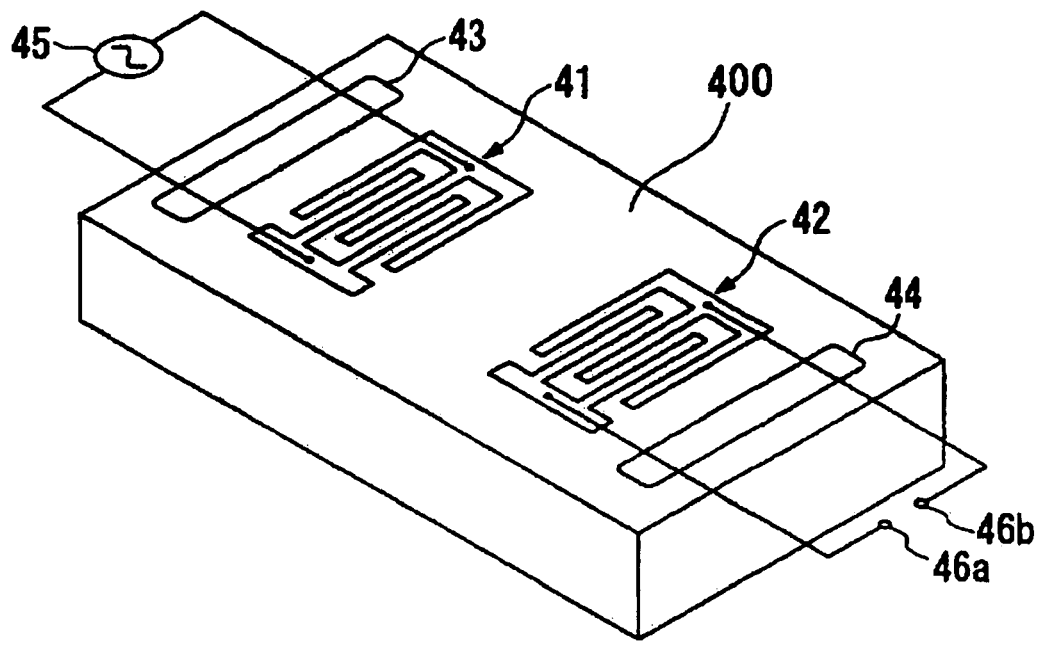
FIG. 12 is a perspective drawing showing the external appearance of the frequency filter according to an embodiment of the present invention.

FIG. 12 is a perspective drawing showing the external appearance of the frequency filter according to an embodiment of the present invention. The frequency filter shown in FIG. 12 has a substrate 400. As shown in FIGS. 3A to 3F, for example, the substrate 400 is a substrate formed by depositing in sequence an initial layer 12 consisting of K, Nb, and O and a $KNbO_3$ single crystal layer 13 on the $SrTiO_3(100)$ single crystal substrate 11, or as shown in FIGS. 8A to 8F, a substrate formed by depositing in sequence a YSZ first buffer layer (a) 22, a $CeO_2$ first buffer layer (b) 23, a $YBa_2Cu_3O_x$ second buffer layer 24, a $SrTiO_3$ third buffer layer 25, an initial layer 26 consisting of K, Nb, and O, and a $KNbO_3$ single crystal layer 27 on a $Si(100)$ single crystal substrate 21, or as shown in FIG. 10, a substrate formed by depositing in sequence a MgO first buffer layer 32, a $SrTiO_3$ second buffer layer 33, an initial layer 34 consisting of K, Nb, and O, and a $KNbO_3$ piezoelectric layer 35 on a substrate 31.

IDT electrode 41 and IDT electrode 42 are formed on the surface of the substrate 400. The IDT electrodes 41 and 42 are formed, for example, from Al or an Al alloy, and the thickness of the IDT electrodes 41 and 42 is set to about $\frac{1}{100}$ of the pitch of the IDT electrodes 41 and 42. In addition, sound absorbing parts 43 and 44 are formed on the surface of the substrate 400 so as to sandwich the IDT electrodes 43 and 44. The sound absorbing parts 43 and 44 absorb the surface acoustic waves that propagate along the surface of the substrate 400. A high frequency signal source 45 is connected to the IDT substrate 41 formed on the substrate 400, and a signal line is connected to the IDT electrode 42. Moreover, the IDT electrode 41 corresponds to what is termed the first electrode in the present invention, and the IDT electrode 42 corresponds to what is termed the second electrode in the present invention.

In the structure described above, when the high frequency signal is output from the high frequency signal source 45, the frequency signal is applied to the IDT electrode 41, and a surface acoustic wave is generated on the surface of the substrate 400. This surface acoustic wave propagates along the surface of the substrate 400 at a velocity of about 4,000 m/s. The surface acoustic wave that has propagated from the IDT electrode 41 towards the sound absorbing part 43 side is absorbed by the sound absorbing part 43, but among the surface acoustic waves that have propagated towards the IDT terminal 42 side, a surface acoustic wave having a particular frequency determined, for example, depending on the pitch of the IDT electrode 42, or having a frequency in a particular band, is converted into an electric signal. This surface acoustic wave is extracted by the terminals 46a and 46b via the signal line. Moreover, most of the frequency components having the particular frequency or a frequency in a particular band pass through the IDT electrode 42 and are absorbed by the sound absorbing part 44.

In this manner, among the electric signals supplied to the IDT electrode 41 provided with the frequency filter of the present embodiment, it is possible to obtain only a surface acoustic wave having a particular frequency or having a frequency in a particular band (filtering).

Frequency Oscillator

Figure 13:
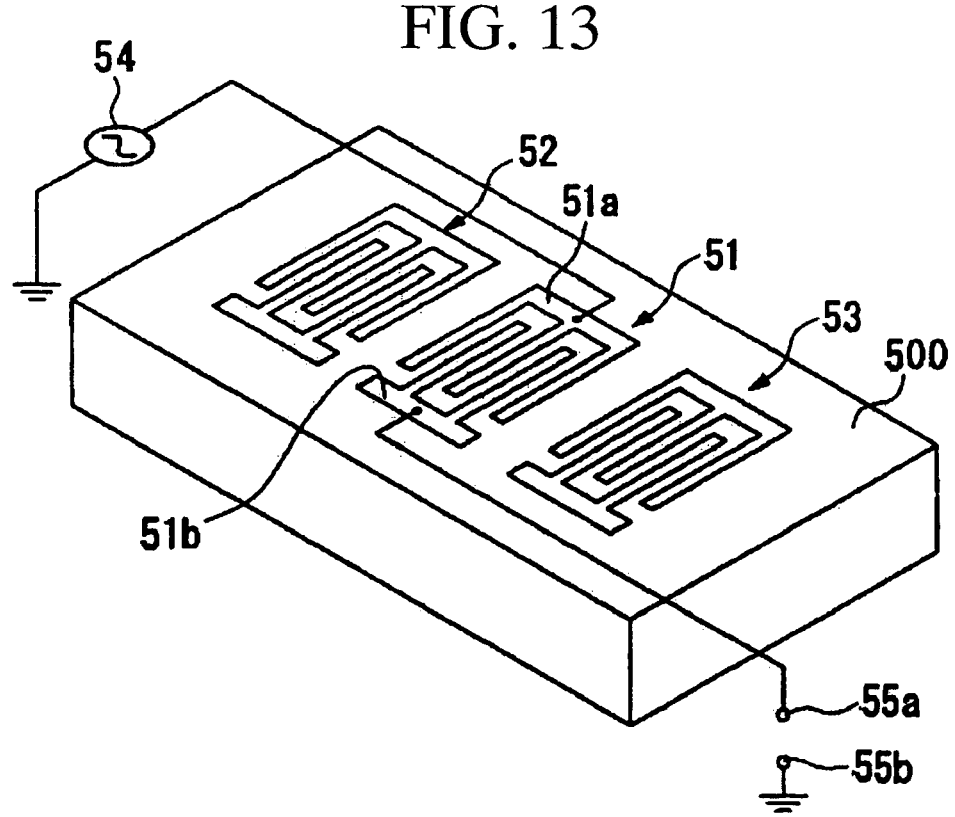
FIG. 13 is a perspective drawing showing the external appearance of the frequency oscillator according to an embodiment of the present invention.

FIG. 13 is a perspective drawing showing the external appearance of the frequency oscillator according to an embodiment of the present invention. The frequency oscillator shown in FIG. 13 has a substrate 500. This substrate 500 is, for example, as shown in FIG. 3F, a substrate formed by depositing in sequence an initial layer 12 consisting of K, Nb, and O and a $KNbO_3$ single crystal layer 13 on a $SrTiO_3(100)$ single crystal substrate 11, or as shown in FIGS. 8A to 8F, a substrate formed by depositing in sequence a YSZ first buffer layer (a) 22, a $CeO_2$ first buffer layer (b) 23, a $YBa_2Cu_3O_x$ second buffer layer 24, a $SrTiO_3$ third buffer layer 25, an initial layer 26 comprising K, Nb, and O, and a $KNbO_3$ single crystal layer 27 on a Si(100) single crystal substrate 21, or as shown in FIG. 10, a substrate formed by depositing in sequence a MgO first buffer layer 32, a $SrTiO_3$ second buffer layer 33, an initial layer 34 consisting of K, Nb, and O, and a $KNbO_3$ piezoelectric layer 35 on a substrate 31.

On the surface of the substrate 500, an IDT electrode 51 is formed, and then IDT electrodes 52 and 53 are formed so as to sandwich the IDT electrode 51. The IDT electrodes 51 to 53 are formed, for example, from Al or an Al alloy, and the respective thickness of the IDE electrodes 51 to 53 is set to about 1/100 of each of the pitches of the IDT electrodes 51 to 53. In addition, the high frequency signal source 54 is connected to one of the interdigital electrodes 51a, which forms the IDT electrode 51, and the other interdigital electrode 51b is connected to the signal line. Moreover, the IDT terminals 52 and 53 correspond to what is termed a resonance electrode in this invention, which causes resonating at a particular frequency component or a frequency component of a particular band of the surface acoustic wave generated by the IDT electrode 51.

In the structure described above, when a high frequency signal is output from the high frequency signal source 54, the frequency signal is applied to the interdigital electrode 51a of the IDT electrode 51, and on surface of the substrate 500, a surface acoustic wave is generated that propagates on the IDT electrode 52 side and a surface acoustic wave is generated that propagates on the IDT electrode 53 side. The velocity of the surface acoustic waves is about 4,000 m/s. A surface acoustic wave having a particular frequency component among these surface acoustic waves is reflected at the IDT electrode 52 and the IDT electrode 53, and thereby a standing wave is generated between the IDT electrode 52 and the IDT electrode 53. The surface acoustic wave having this particular frequency component is repeatedly reflected at the IDT terminals 52 and 53, and thereby the particular frequency component or the frequency component having a particular band resonates, and the amplitude increases. A part of the surface acoustic wave having this particular frequency component or the frequency component having a particular band is extracted from the other interdigital electrode 51b of the IDT electrode 51, and an electric signal having a frequency depending on the resonance frequency (or a frequency having a band of a certain degree) of the IDT electrode 52 and the IDT electrode 53 can be extracted at the terminal 55a and the terminal 55b.

Figure 14A:
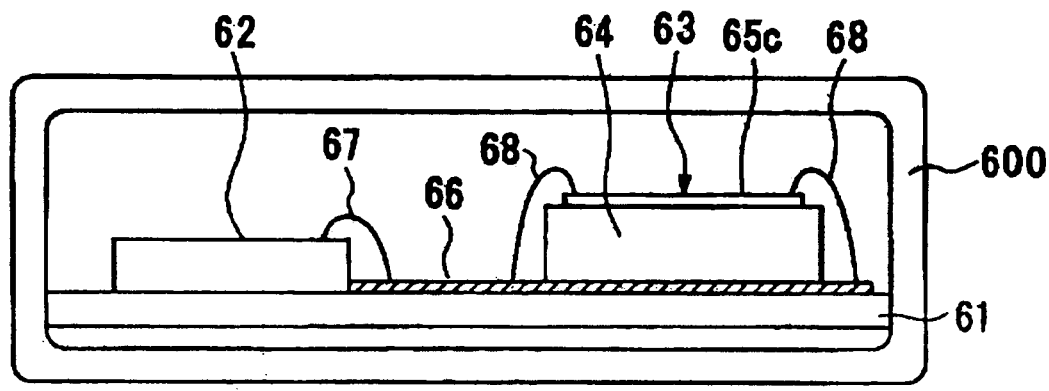
FIG. 14A is a side perspective view showing an example of the surface acoustic wave element (frequency oscillator) of an embodiment of the present invention applied to a VCSO (Voltage Controlled SAW Oscillator)
Figure 14B:
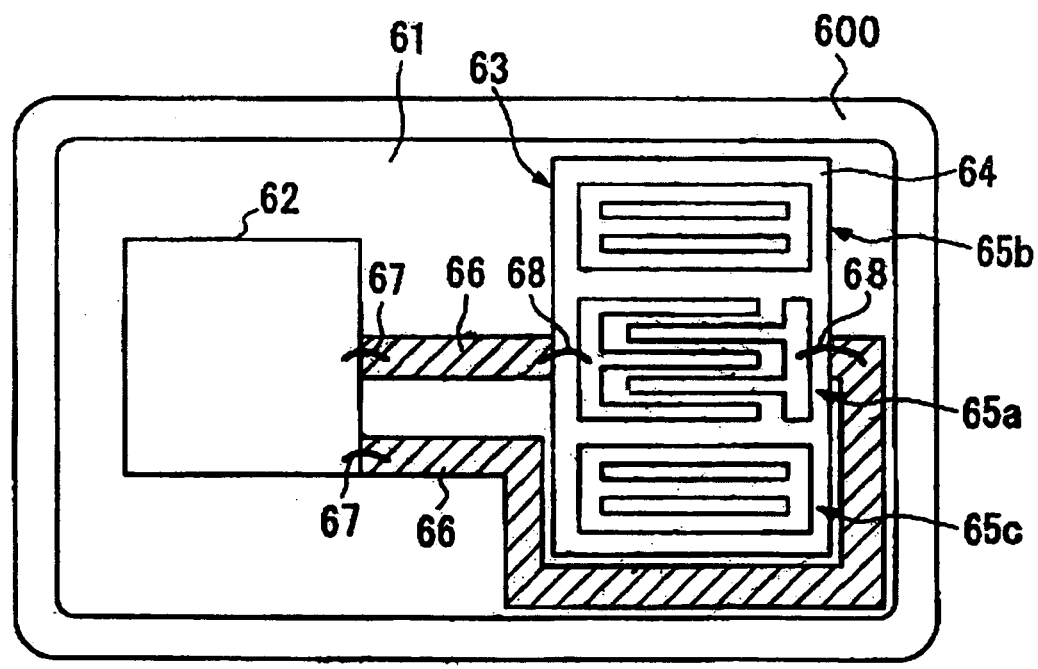
FIG. 14B is a top perspective view of the same.

FIGS. 14A and 14B are a drawings showing an example in which the surface acoustic wave element (frequency oscillator) of the embodiment of the present invention is applied to a VCSO (Voltage Controlled SAW Oscillator), where 14A is a side perspective view and 14B is a top perspective view. The VCSO is mounted inside a case 600 made of metal (aluminum and stainless steel). Reference numeral 61 is a substrate, and the IC (integrated circuit) 62 and the frequency oscillator 63 are mounted on this substrate. The IC 62 controls the frequency applied to the frequency oscillator 63 depending on the voltage value input from an external circuit (not illustrated).

The frequency oscillator 63 has the IDT electrodes 65a to 65c formed on the substrate 64 thereof, and this structure is substantially identical to the frequency oscillator shown in FIG. 13. Moreover, for example, the substrate is, as shown in FIGS. 3A to 3F, a substrate formed by depositing in sequence an initial layer 12 consisting of K, Nb, and O and a $KNbO_3$ single crystal layer 13 on a $SrTiO_3(100)$ single crystal substrate 11, or, as shown in FIGS. 8A to 8F, a substrate formed by depositing in sequence a YSZ first buffer layer (a) 22, a $CeO_2$ first buffer layer (b) 23, a $YBa_2Cu_3O_x$ second buffer layer 24, a $SrTiO_3$ third buffer layer 25, an initial layer 26 consisting of K, Nb, and 0, and a $KNbO_3$ single crystal layer 27 on a Si(100) single crystal substrate 21, or as shown in FIG. 10, a substrate formed by depositing in sequence a MgO fist buffer layer 32, a $SrTiO_3$ second buffer layer 33, an initial layer 34 consisting of K, Nb, and O, and a $KNbO_3$ piezoelectric layer 35 on a substrate 31.

Wiring 66 is patterned on the substrate 61 in order to connect electrically the IC 62 and the frequency oscillator 63. The IC 62 and the wiring 66 are connected by, for example, a wire line 67, such as metal wire, the frequency oscillator 63 and the wiring 66 are connected by a wire line 68 made, for example, of a metal wire, and thereby the IC 62 and the frequency oscillator 63 are electrically connected via the wiring 66.

Figure 15:
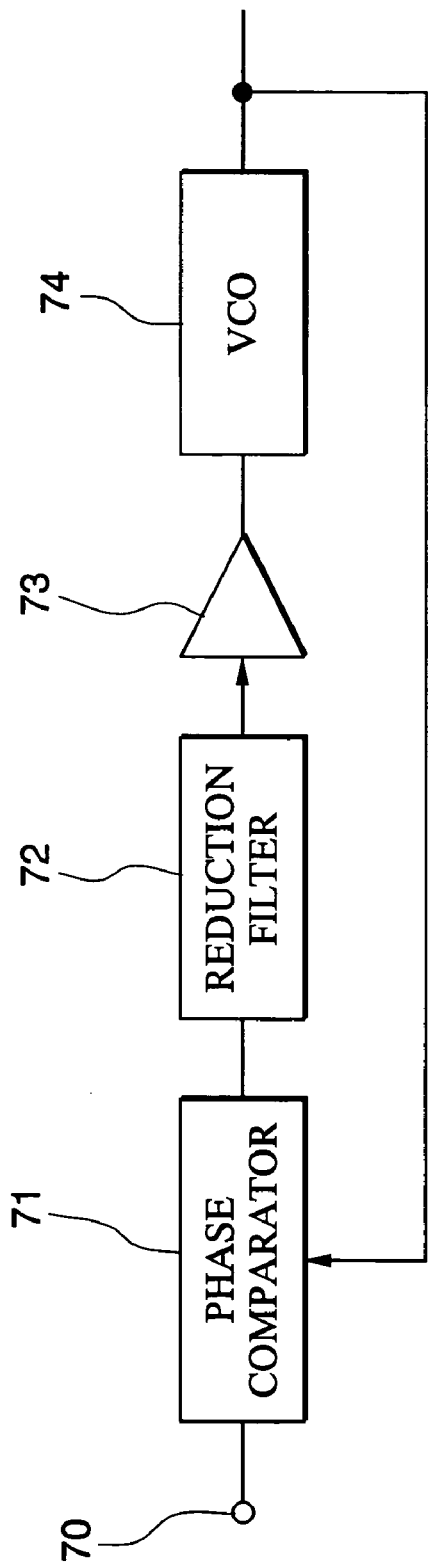
FIG. 15 is a block diagram of the basic structure of a PLL circuit.

The VCSO shown in FIG. 14 is used as a VCO (Voltage Controlled Oscillator) for the PLL circuit shown in FIG. 15. Here, the PPL circuit will be simply explained. FIG. 15 is a block diagram showing the basic structure of the PPL circuit. As shown in FIG. 15, the PPL circuit is formed by a phase comparator 71, a reduction filter 72, an amplifier 73, and a VCO 74.

The phase comparator 71 compares the phases (or frequencies) of the signals input from the input terminal 70 with the output signal of the VCO 74, and outputs an error voltage signal whose value is set depending on the difference therebetween. The reduction filter 72 allows only the low frequency component of the error electric signal output from the phase comparator 71 to pass, and the amplifier 73 amplifies the signal output from the reduction filter 72. The VCO 74 is an oscillating circuit in which the oscillating frequency varies continuously within a range that depends on the input voltage value. The PPL circuit acts such that the difference between the phases (or frequencies) input from the input terminal 70 is reduced, and when the frequency of the signal output from the VCO 74 is synchronized with the frequency of the signal input from the input terminal 70, subsequently, a signal is output so as to match the signal input from the input terminal by excluding a certain phase difference or so as to follow the variation in the input signal.

Electronic Circuit

Figure 16:
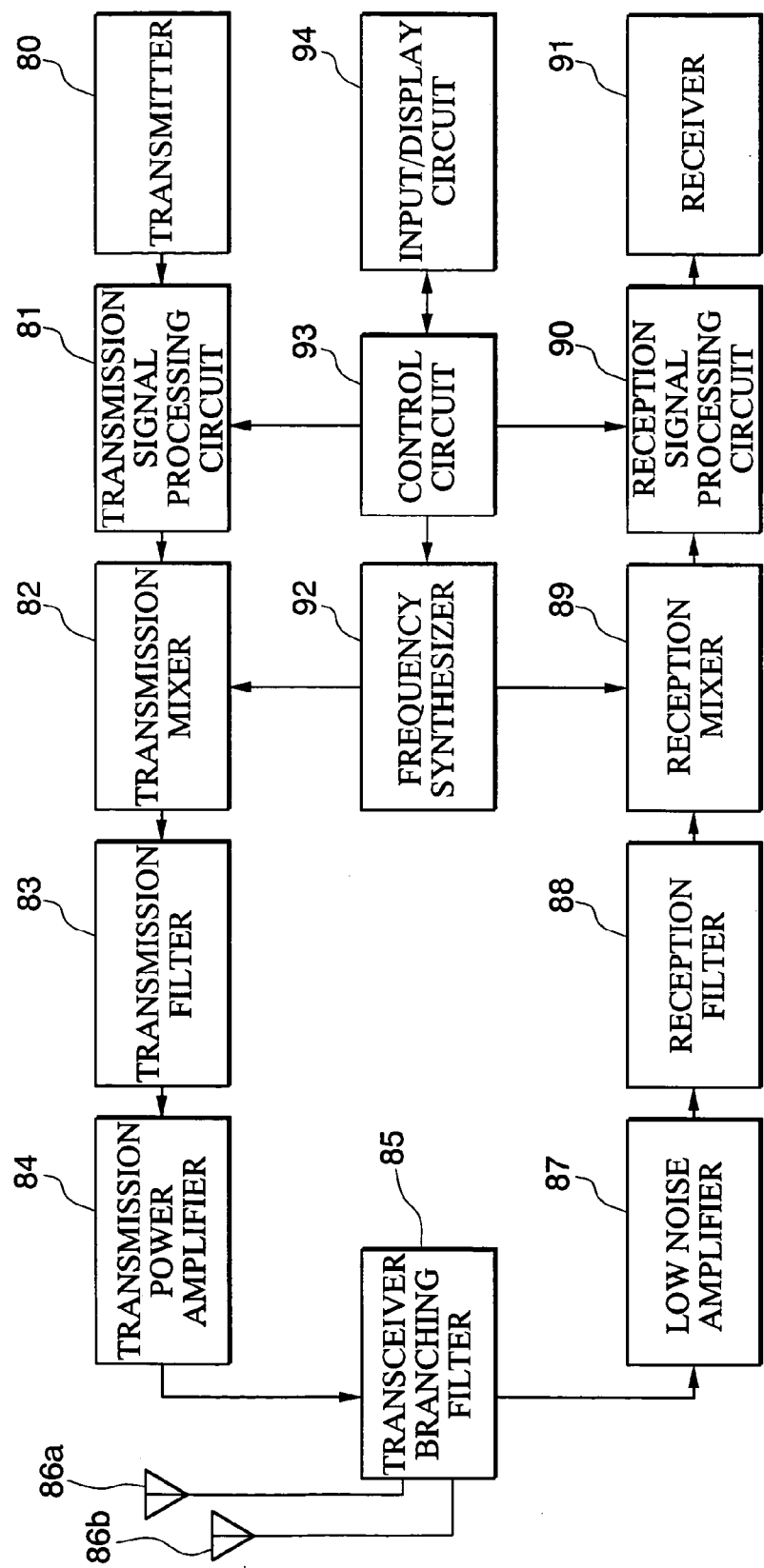
FIG. 16 is a block diagram showing the electrical structure of an electrical circuit according to an embodiment of the present invention.
Figure 17:
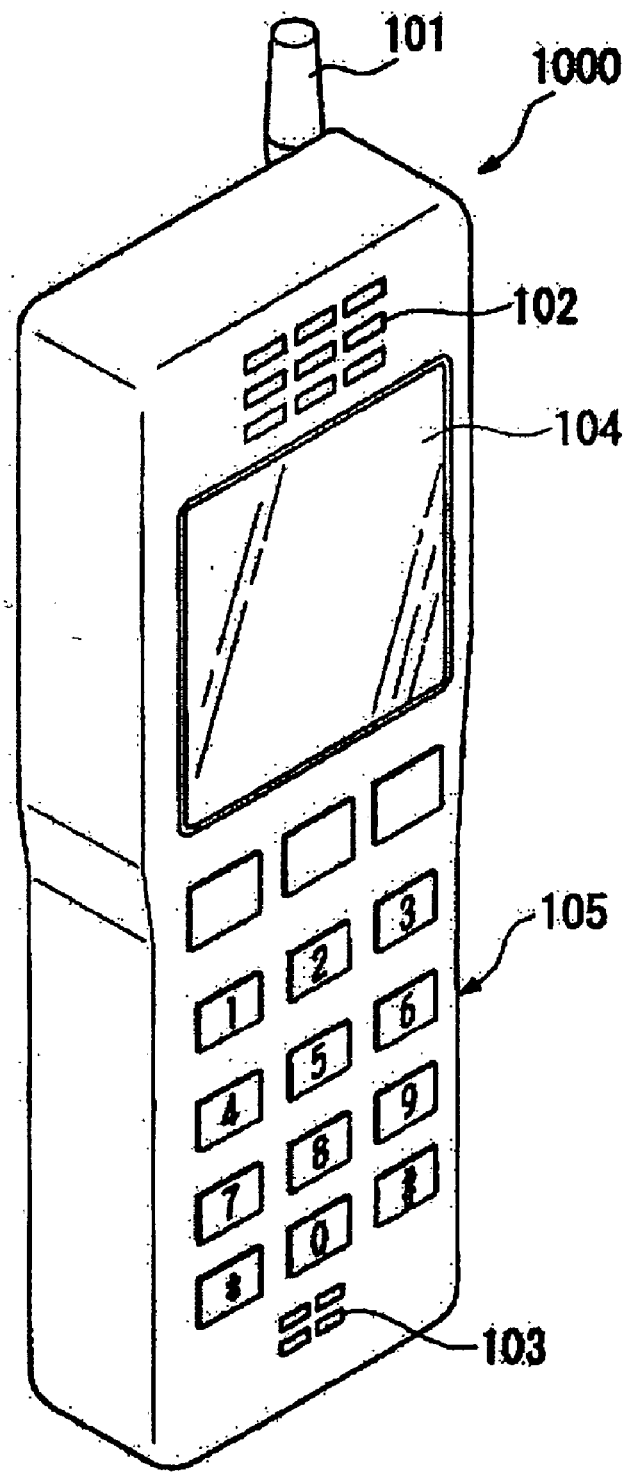
FIG. 17 is a perspective drawing showing an example of the external appearance of a cellular phone, which is one electrical device according to an embodiment of the present invention.

FIG. 16 is a block drawing showing the electrical structure of the electronic circuit according to an embodiment of the present invention. Moreover, the electronic circuit shown in FIG. 16 is a circuit provided inside a mobile telephone 1000 shown in FIG. 17. FIG. 17 is a perspective drawing showing an example of the external appearance of the mobile telephone as one electronic device according to an embodiment of the present invention. The mobile telephone 1000 shown in FIG. 17 provides an antenna 101, a receiver 102, and transmitter 103, a liquid crystal display 104, and control keys 105.

The electronic circuit shown in FIG. 16 shows the basic structure of the electronic circuit provided in the mobile telephone 1000, and is formed by a transmitter 80, a transmission signal processing circuit 81, a transmission mixer 82, a transmission filter 83, a transmission power amplifier 84, a transceiver branching filter 85, antennas 86*a* and 86*b*, a low noise amplifier 87, a reception filter 88, a reception mixer 89, a reception signal processing circuit 90, a receiver 91, a frequency synthesizer 92, a control circuit 93, and an input/display circuit 94. The transmission signal processing unit 81 is a circuit that implements, for example, D/A conversion processing, modulation processing, and the like on the electric signal output from the transmitter 80. The circuit structure of the transmission mixer 82 is more complicated because the mobile telephone carries out the frequency conversion processing a plurality of times.

The receiver 80 is realized, for example, by a microphone that converts sound signals to electrical signals, and by using the signal output from the frequency mixer 92, which corresponds to the transmitter 103 in FIG. 17, the signal output from the transmission signal processing circuit 81 is mixed. Moreover, the frequency of the signal supplied to the transmission mixer 82 is, for example, 380 MHz. The transmission filter 83 allows only the signal having the frequency required among the intermediate frequencies (IF) to pass, and the signals having unnecessary frequencies are cut. The signal output form the transmission filter 83 is converted to an RF signal by a conversion circuit (not illustrated). The frequency of this RF signal is, for example, about 1.9 GHz. The transmission power amplifier 84 amplifies the electric power of the RF signal output from the transmission filter 82, and outputs it to the transceiver branching filter 85.

The transmission branching filter 85 transmits an RF signal output from the transmission power amplifier 84 in the form of an electric wave from the antennas 86*a* and 86*b*. In addition, the transmission branching filter 85 separates the reception signal received by the antennas 86*a* and 86*b*, and outputs these to the low noise amplifier 87. The frequency of the received signals output from the transceiver branching filter 85 is, for example, about 2.1 GHz. The low noise amplifier 87 amplifies the received signals from the transceiver branching filter 85. Moreover, the signal output from the low noise amplifier 87 is converted to an intermediate signal (IF) by a conversion circuit (not illustrated).

The reception filter 88 allows only signals having the required frequency among the intermediate frequencies (IF) converted by the conversion circuit (not illustrated) to pass, and the signals having unnecessary frequencies are cut. The reception mixer 89 mixes the signals output from the transmission signal processing circuit 81 using the signal output from the frequency synthesizer 92. Moreover, the intermediate frequency supplied to the reception mixer 89 is, for example, 190 MHz. The reception signal processing circuit 80 is a circuit that implements, for example, A/D conversion processing and demodulation processing of the signal output from the reception mixer 89. The receiver 91 is realized, for example, by a small speaker that converts an electric signal to sound, and corresponds to the receiver 102 in FIG. 17.

The frequency synthesizer 92 is a circuit that generates the signal supplied to the transmission mixer 82 (for example, a frequency of about 380 MHz), a signal supplied to the reception mixer 89 (for example, a frequency of about 380 MHz), and a signal supplied to the reception mixer 89 (for example, a frequency of about 190 MHz). Moreover, the frequency synthesizer provides a PPL circuit that emits an oscillation frequency of, for example, 760 MHz. The signal output from this PPL circuit is divided, a signal having a frequency of 380 MHz is generated and then divided to generate a signal having a frequency of 190 MHz. The control circuit 93 controls the overall operation of the mobile telephone by controlling the transmission signal processing circuit 81, the reception signal processing unit 90, the frequency synthesizer 92, and the input/display circuit 94. The input/display circuit 94 is for displaying the state of the device to the user of the mobile telephone 1000, and for inputting the instructions of the operator, and corresponds, for example, to the liquid crystal display 104 and the operating keys 105 shown in FIG. 17.

In the electronic circuit having the structure described above, the frequency filter shown in FIG. 12 is used as the transmission filter 83 and the reception filter 88. The filtered frequency (the frequency allowed to pass) is set separately by the transmission filter 83 and the reception filter 88 depending on the required frequency among the signals output from the transmission mixer 82 and the required frequency for the reception mixer 89. In addition, the PPL circuit provided in the frequency synthesizer 92 provides as the VCO 64 of the PPL circuit shown in FIG. 15 the frequency oscillator shown in FIG. 13 or the frequency oscillator (VCSO) shown in FIG. 14.

Above, the surface acoustic wave element, the frequency filter, the frequency oscillator, the electronic circuit, and the electronic device according to embodiments of the present invention have been explained, but the invention is not limited by the above embodiments, and free variations in the range of the present invention are possible. For example, in the embodiments described above, a mobile telephone was used in the explanation as an example of an electronic device, and an electronic circuit provided in a mobile telephone was used in the explanation as an electronic circuit. However, the present invention is not limited to a mobile telephone, and can be applied to any type of mobile communication device and the electronic circuits therein.

Furthermore, the invention can be applied not only to mobile telecommunication devices, but to communication devices that are used in a stationary state, for example, a tuner that receives BS (Broadcast Satellite) or CS (Commercial Satellite) broadcasts and the electronics provided therein. In addition, as a communication carrier, besides a communication device that uses electric waves propagating through the air, the present invention can also be applied to an electronic device such as a HUB that uses a high frequency signal propagated through a coaxial cable or a light signal propagated through an optical cable.

As described above, in the thin film production process using a vapor phase method according to the present invention, by depositing at a high deposition rate a raw material having a composition from $K_2O:Nb_2O_5=50:50$ to $K_2O:Nb_2O_5=65:35$ on various types of inexpensive substrates maintained at or above the eutectic temperature of potassium niobate and $3K_2O:Nb_2O_5$ and growing a single crystal potassium niobate film whose composition does not deviate from the liquid phase using the substrate as the starter for the crystal growth, it is possible to realize a surface acoustic wave element that has a high electromechanical coupling coefficient. Furthermore, by using this surface acoustic wave element, it is possible to realize a small frequency filter and frequency oscillator. Furthermore, by mounting this frequency oscillator, it is possible to realize energy saving in the electronic circuit and the electronic device.

Japanese Patent Application No. 2003-013608 filed Jan. 22, 2003 is hereby incorporated by reference.

What is claimed is:

1. A method of manufacturing a potassium niobate ($KNbO_3$) single crystal thin film, comprising the steps of:
    maintaining the substrate under a predetermined oxygen partial pressure;
    maintaining the substrate within a temperature region which is equal to or higher than an eutectic temperature of $KNbO_3$ and $3K_2O.Nb_2O_5$ and is equal to or lower than complete melting temperature of $KNbO_3$ and $3K_2O.Nb_2O_5$ so that a solid phase of $KNbO_3$ and a liquid phase can coexist on the substrate;
    depositing a vapor phase material on the substrate in a state in which a solid phase and a liquid phase coexist; and
    precipitating $KNbO_3$ on the substrate from the liquid phase as a solid phase to grow a $KNbO_3$ single crystal thin film.

2. A method of manufacturing a potassium niobate single crystal thin film according to claim 1, wherein the composition of a starting material to be vaporized to generate the vapor phase material is from $K_2O.Nb_2O_5=50:50$ to $K_2O.Nb_2O_5=65:35$.

3. A method of manufacturing a potassium niobate single crystal thin film according to claim 1, wherein the surface of the substrate has a structure in which crystal axes are oriented with respect to the surface in both the perpendicular and parallel directions, and $KNbO_3$ precipitated from the liquid phase is grown into a single crystal using the substrate as the seed crystal.

4. A method of manufacturing a potassium niobate single crystal thin film according to claim 3, further comprising the step of physically or chemically removing the liquid phase which remains on the surface of the potassium niobate single crystal thin layer after the single crystal is grown.

5. A method of manufacturing a potassium niobate single crystal thin film according to claim 3, further comprising the step of, before the $KNbO_3$ is precipitated from the liquid phase, terminating the surface of the substrate with niobium atoms and potassium atoms by depositing niobium atoms and potassium atoms on the surface of the substrate at a low deposition rate in order to improve the crystallinity of the potassium niobate single crystal thin film.

6. A method of manufacturing a potassium niobate single crystal thin film according to claim 3, wherein the substrate comprises a silicon single crystal substrate, a buffer layer grown epitaxially on the silicon single crystal substrate, and a potassium niobate single crystal thin film grown epitaxially on the buffer layer.

7. A method of manufacturing a potassium niobate single crystal thin film according to claim 6, the buffer layer comprises:
    a first buffer layer consisting of a NaCl-type oxide that includes a metal that thermodynamically bonds more easily to oxygen than silicon; and
    a second buffer layer consisting of a simple perovskite-type oxide deposited on the first buffer layer.

8. A method of manufacturing a potassium niobate single crystal thin film according to claim 6, wherein the buffer layer comprises:
    a first buffer layer that consists of a fluorite-type oxide that includes a metal that thermodynamically bonds more easily to oxygen than silicon;
    a second buffer consisting of a layered perovskite-type oxide that is deposited on the first buffer layer; and
    a third buffer layer consisting of a simple perovskite-type oxide that is deposited on the second buffer layer.

9. A method of manufacturing a potassium niobate single crystal thin film according to claim 3, wherein the substrate comprises:
    a base substrate that is a single crystal, a polycrystal, or amorphous;
    a buffer layer that is grown on the base substrate at an in-plane orientation irrespective of the crystal orientation of the substrate by a vapor phase method involving ion beam irradiation; and
    a potassium niobate single crystal thin film that is grown epitaxially on the buffer layer.

10. A method of manufacturing a potassium niobate single crystal thin film according to claim 9, wherein the buffer layer comprises:
    a first buffer layer consisting of a NaCl-type oxide; and
    a second buffer layer consisting of a simple perovskite-type oxide that is deposited on the first buffer layer.

11. A method of manufacturing a potassium niobate single crystal thin film according to claim 9, wherein the buffer layer comprises:
    a first buffer layer consisting of a fluorite-type oxide;
    a second buffer layer consisting of a layered perovskite-type oxide that is deposited on the first buffer layer; and
    a third buffer layer consisting of a simple perovskite-type oxide that is deposited on the second buffer.

* * * * *

UNITED STATES PATENT AND TRADEMARK OFFICE
CERTIFICATE OF CORRECTION

PATENT NO. : 7,223,305 B2
APPLICATION NO. : 10/761147
DATED : May 29, 2007
INVENTOR(S) : Takamitsu Higuchi, Setsuya Iwashita and Hiromu Miyazawa It is certified that error appears in the above-identified patent and that said Letters Patent is hereby corrected as shown below:

Title Page;
FRONT PAGE, (57) ABSTRACT
| | |
|---|---|
| Line 6: | "3K2O.Nb2O5" should be --3K2O·Nb2O5-- |
| Line 7: | "3K2O.Nb2O5" should be --3K2O·Nb2O5-- |
| Line 15: | "K2O.Nb2O5=50:50" should be --K2O·Nb2O5=50:50-- |
| Line 15: | "K2O.Nb2O5=65:35." should be --K2O·Nb2O5=65:35.-- |
| Column 2, Line 17: | "Vol" should be --Vol.-- |
| Column 2, Line 47: | "K2O.Nb2O5" should be --K2O·Nb2O5-- |
| Column 2, Line 50: | "3K2O.Nb2O5" should be --"3K2O·Nb2O5-- |
| Column 2, Line 51: | "845°" should be --845° C.-- |
| Column 2, Line 51: | "3K2O.Nb2O5," should be --"3K2O·Nb2O5,-- |
| Column 2, Line 52: | "3K2O.Nb2O5" should be --"3K2O·Nb2O5-- |
| Column 2, Line 54: | "2K2O.3Nb2O5" should be --"2K2O·3Nb2O5-- |
| Column 2, Line 56: | "2K2O.3Nb2O5" should be --"2K2O·3Nb2O5-- |
| Column 2, Line 67: | "K2O.Nb2O5" should be --"K2O·Nb2O5-- |
| Column 3, Line 5: | "3K2O.Nb2O5." should be --"3K2O·Nb2O5.-- |
| Column 3, Line 15: | "845°" should be --845° C.-- |
| Column 3, Line 16: | "3K2O.Nb2O5." should be --"3K2O·Nb2O5.-- |
| Column 3, Line 40: | "3K2O.Nb2O5," should be --"3K2O·Nb2O5,-- |
| Column 7, Line 29: | "in" should be --is-- |
| Column 7, Line 50: | "again it" should be --it again-- |

UNITED STATES PATENT AND TRADEMARK OFFICE
CERTIFICATE OF CORRECTION

PATENT NO.      : 7,223,305 B2
APPLICATION NO. : 10/761147
DATED           : May 29, 2007
INVENTOR(S)     : Takamitsu Higuchi, Setsuya Iwashita and Hiromu Miyazawa It is certified that error appears in the above-identified patent and that said Letters Patent is hereby corrected as shown below:

Column 10, Line 63:   after "28" insert --is--

Column 11, Line 3:    "700°." should be --700° C.--

Column 11, Line 51:   "Th," should be --Tb,--

Column 12, Line 43:   "Th," should be --Tb,--

Column 12, Line 45:   "Th," should be --Tb,--

Column 12, Line 46:   "Th," should be --Tb,--

Column 13, Line 10:   "Th," should be --Tb,--

Column 13, Line 11:   "Tb," should be --Yb,--

Column 13, Line 12:   "Th," should be --Tb,--

Column 15, Line 3:    "and", first occurrence, should be --an--

Column 15, Line 22:   "a" should be --an--

Column 16, Line 4:    "bream" should be --beam--

Column 16, Line 52:   "Th," should be --Tb,--

Column 16, Line 54:   "Th," should be --Tb,--

Column 18, Line 24:   "(O $\leq$ x" should be --(0 $\leq$ x--

Column 18, Line 39:   "0," should be --O,--

Column 19, Line 43:   "IDE" should be --IDT--

Column 20, Line 12:   delete "a"

Column 20, Line 35:   "0," should be --O,--

Column 20, Line 38:   "fist" should be --first--

UNITED STATES PATENT AND TRADEMARK OFFICE
CERTIFICATE OF CORRECTION

PATENT NO.        : 7,223,305 B2
APPLICATION NO.   : 10/761147
DATED             : May 29, 2007
INVENTOR(S)       : Takamitsu Higuchi, Setsuya Iwashita and Hiromu Miyazawa It is certified that error appears in the above-identified patent and that said Letters Patent is hereby corrected as shown below:

Column 20, Line 51:   "PLL" should be --PPL--

Column 21, Line 47:   "form" should be --from--

Column 23, Line 28:   "3K2O.Nb2O5" should be --"3K2O·Nb2O5--

Column 23, Line 30:   "3K2O.Nb2O5" should be --"3K2O·Nb2O5--

Column 23, Line 41:   "K2O.Nb2O5=50:50" should be --"K2O·Nb2O5=50:50--

Column 23, Line 42:   "K2O.Nb2O5=65:35." should be --"K2O·Nb2O5=65:35.--

Column 24, Line 15:   "NaCI-type" should be --NaCl-type--

Column 24, Line 45:   "NaCI-type" should be --NaCl-type--

Signed and Sealed this

Sixth Day of May, 2008

JON W. DUDAS
*Director of the United States Patent and Trademark Office*